United States Patent
Li et al.

(10) Patent No.: US 12,489,091 B2
(45) Date of Patent: Dec. 2, 2025

(54) LIGHT-EMITTING SUBSTRATE AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Zhentao Li, Beijing (CN); Tsung Chieh Kuo, Beijing (CN); Zhi Zhang, Beijing (CN); Jie Wang, Beijing (CN); Penghua Wang, Beijing (CN)

(73) Assignees: Hefei Xinsheng Optoelectronics Technology Co., Ltd., Anhui (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/757,961

(22) PCT Filed: Aug. 30, 2021

(86) PCT No.: PCT/CN2021/115478
§ 371 (c)(1),
(2) Date: Jun. 24, 2022

(87) PCT Pub. No.: WO2023/028793
PCT Pub. Date: Mar. 9, 2023

(65) Prior Publication Data
US 2024/0194651 A1    Jun. 13, 2024

(51) Int. Cl.
*H01L 25/075* (2006.01)
*H10D 86/40* (2025.01)
*H10D 86/60* (2025.01)

(52) U.S. Cl.
CPC ....... *H01L 25/0753* (2013.01); *H10D 86/441* (2025.01); *H10D 86/60* (2025.01)

(58) Field of Classification Search
CPC ... G09G 3/342; G09G 3/32; G09G 2300/0426
See application file for complete search history.

(56) References Cited

U.S. PATENT DOCUMENTS

2008/0099772 A1* 5/2008 Shuy .................... H10H 29/142
                                                            257/93
2009/0316409 A1  12/2009 Kim et al.
(Continued)

FOREIGN PATENT DOCUMENTS

CN    101072464 A    11/2007
CN    101614381 A    12/2009
(Continued)

OTHER PUBLICATIONS

Extended European Search Report, mailed Feb. 27, 2024, from EP Serial No. 21955372.4, 10 pages.

*Primary Examiner* — Yuzhen Shen
(74) *Attorney, Agent, or Firm* — Workman Nydegger

(57) ABSTRACT

Disclosed are a light-emitting substrate and a display device. The light-emitting substrate includes a substrate; a first conductive layer arranged on the substrate, the first conductive layer including a plurality of driving voltage lines arranged at intervals; and a plurality of light-emitting components arranged on one side, away from the substrate, of the first conductive layer, each of the light-emitting components including a plurality of light-emitting elements, the plurality of light-emitting elements being divided into a plurality of element groups, and in the same light-emitting component, at least two element groups being electrically connected to different driving voltage lines.

15 Claims, 11 Drawing Sheets

(56) References Cited

U.S. PATENT DOCUMENTS

| | | | |
|---|---|---|---|
| 2017/0309227 A1* | 10/2017 | Ebisuno | H10K 59/131 |
| 2018/0061908 A1 | 3/2018 | Shim et al. | |
| 2018/0174973 A1* | 6/2018 | Aoyagi | H10F 77/933 |
| 2020/0075667 A1* | 3/2020 | Lee | H10D 86/60 |
| 2020/0194288 A1 | 6/2020 | Hussell et al. | |
| 2022/0208130 A1* | 6/2022 | Park | G09G 3/3291 |
| 2022/0246086 A1* | 8/2022 | Son | G09G 3/30 |

FOREIGN PATENT DOCUMENTS

| | | |
|---|---|---|
| CN | 104347034 A | 2/2015 |
| CN | 207353247 U | 5/2018 |
| CN | 108831314 A | 11/2018 |
| CN | 110649059 A | 1/2020 |
| CN | 210518940 U | 5/2020 |
| CN | 111798803 A | 10/2020 |
| EP | 1473690 A2 | 11/2004 |
| KR | 20180025520 A | 3/2018 |
| KR | 20190012970 A | 2/2019 |

\* cited by examiner

LIGHT-EMITTING SUBSTRATE AND DISPLAY DEVICE

CROSS REFERENCE TO RELATED APPLICATIONS

The present disclosure is a US National Stage of International Application No. PCT/CN2021/115478, filed on Aug. 30, 2021, the entire contents of which are incorporated herein by reference.

FIELD

The present disclosure relates to the field of display, and in particular to a light-emitting substrate and a display device.

BACKGROUND

With the light-emitting diode technology developing, backlights with sub-millimeter-grade or even micron-grade light-emitting diodes have been applied in a wide range. With the backlights utilized, transmissive displays are rendered the same picture contrast as organic light-emitting diode (OLED) displays as well as technical advantages of liquid crystal display (LCD), thereby improving a picture display effect and providing a better visual experience for users.

SUMMARY

A light-emitting substrate provided in an embodiment of the present disclosure includes: a substrate; a first conductive layer arranged on the substrate, and including a plurality of driving voltage lines arranged at intervals; and a plurality of light-emitting components arranged on one side, away from the substrate, of the first conductive layer, where each of the plurality of light-emitting components includes a plurality of light-emitting elements, and the plurality of light-emitting elements are divided into a plurality of element groups, and in a same light-emitting component, at least two of the plurality of element groups are electrically connected to different driving voltage lines.

In some embodiments, one of the plurality of light-emitting components is connected to two driving voltage lines, an orthographic projection of one of the two driving voltage lines on the substrate overlaps an orthographic projection of the light-emitting component on the substrate, and an orthographic projection of the other driving voltage line on the substrate does not overlap that the orthographic projection of the light-emitting component on the substrate.

In some embodiments, the light-emitting substrate further includes: a first insulation layer arranged between the first conductive layer and the plurality of light-emitting components; a second conductive layer arranged between the first insulation layer and the plurality of light-emitting components; and a second insulation layer arranged between the second conductive layer and the plurality of light-emitting components; and the second conductive layer includes: a plurality of element wires arranged at intervals; and in each of the plurality of element groups, two adjacent light-emitting elements are electrically connected to each other through an element wire.

In some embodiments, the first conductive layer further includes a plurality of common voltage lines and a plurality of source voltage lines arranged at intervals; the plurality of driving voltage lines, the plurality of common voltage lines, and the plurality of source voltage lines extend in a first direction, and are repeatedly arranged in a second direction in an order of the driving voltage lines, the common voltage lines, and the source voltage lines; a plurality of first hollowed-out gaps are provided between driving voltage lines and common voltage lines adjacent to each other, a plurality of second hollowed-out gaps are provided between common voltage lines and source voltage lines adjacent to each other, and a plurality of third hollowed-out gaps are provided between source voltage lines and driving voltage lines adjacent to each other; and the plurality of first hollowed-out gaps, the plurality of second hollowed-out gaps, and the plurality of third hollowed-out gaps are each provided with one element group in one column of the light-emitting components and element wires connected between adjacent light-emitting elements in the element group.

In some embodiments, two sides of the common voltage lines are provided with different element groups of a same light-emitting component; and the element groups arranged on the two sides of the common voltage lines are electrically connected to different driving voltage lines.

In some embodiments, in the same light-emitting component, different element groups are arranged in parallel through first connectors; and in the same light-emitting component, parallel connection positions have a lowest voltage.

In some embodiments, a voltage on a first connector is lower than or equal to a voltage of a common voltage line.

In some embodiments, the voltage on the common voltage line is a grounding voltage.

In some embodiments, a voltage on a first connector is lower than or equal to a voltage of a driving voltage line.

In some embodiments, the number of light-emitting components electrically connected to each of a second driving voltage line to an $(N-1)^{th}$ driving voltage line is the same, and N is the total number of the driving voltage lines in the light-emitting substrate.

In some embodiments, the number of element groups electrically connected to each of the second driving voltage line to the $(N-1)^{th}$ driving voltage line is the same.

In some embodiments, the number of light-emitting elements electrically connected to each of the second driving voltage line to the $(N-1)^{th}$ driving voltage line is the same.

In some embodiments, one column of the light-emitting components correspond to one of the driving voltage lines, one of the common voltage lines, and one of the source voltage lines; and in the second direction, one driving voltage line is arranged on one side, away from the common voltage line, of a last source voltage line; and the second conductive layer includes: a plurality of jumper lines, where element groups arranged at second hollowed-out gaps are electrically connected to driving voltage lines arranged on one sides, away from the common voltage lines, of the source voltage lines through the jumper lines.

In some embodiments, the second conductive layer further includes a plurality of connection pads, one electrode of each of the light-emitting elements is electrically connected to one connection pad; and orthographic projections of the jumper lines on the substrate do not overlap orthographic of the connection pads on the substrate.

In some embodiments, the second conductive layer further includes: a plurality of second connectors, in the same light-emitting component, and element groups arranged on one side, facing the driving voltage line, of the common voltage line are electrically connected to a same driving voltage line through the second connectors, respectively; portions, close to the driving voltage lines electrically connected, of the jumper lines include first avoidance portions and second avoidance portions, the first avoidance portions extend in the first direction, the second avoidance portions extend in the second direction, and a length of a second avoidance portion ranges from 3.0 mm to 3.1 mm; and in the same row, first avoidance gaps are provided between one sides, facing the second avoidance portions, of second connectors electrically connected to the driving voltage lines and one sides, away from the second connectors, of the second avoidance portions, and a width of a first avoidance gap ranges from 0.9 mm to 1.0 mm.

In some embodiments, orthographic projections of the jumper lines on the substrate do not overlap orthographic projections of the common voltage lines on the substrate.

In some embodiments, each of the light-emitting components further includes a driving circuit, and the driving circuit includes a common voltage end and an output end, the common voltage end is electrically connected to a common voltage line; and in the same light-emitting component, last light-emitting elements in different element groups are electrically connected to the output end.

In some embodiments, the plurality of light-emitting elements in the light-emitting components are divided into M element groups, each of the M element groups includes N light-emitting elements arranged in the first direction, the M element groups are arranged in the second direction, N is an integer greater than 0, and M is an integer greater than 0; the plurality of element groups in the plurality of light-emitting components are sequentially numbered in the second direction, light-emitting component columns are sequentially numbered in the second direction, a first light-emitting element in an element group numbered k in a light-emitting component numbered a is electrically connected to a driving voltage line corresponding to the light-emitting component numbered a, and a first light-emitting element in an element group numbered M in the light-emitting component numbered a is electrically connected to a driving voltage line corresponding to a light-emitting component numbered a+1; and in the light-emitting component numbered a, a last light-emitting element in the element group numbered k is electrically connected to a last light-emitting element in an element group numbered k+1 through a first connector; and a last light-emitting element in the element group numbered M in the light-emitting component numbered a is electrically connected to an output end of a driving circuit, where a is an integer greater than 0, 1≤k≤M, and k is an integer.

In some embodiments, cascade wires are arranged on the first conductive layer, the first conductive layer further includes a cascade connection line, and the second conductive layer further includes a cascade bridge portion; a first end of the cascade wire is electrically connected to the last light-emitting element in the element group numbered M in the light-emitting component numbered a, and a second end of the cascade wire is electrically connected to a first input end of a driving circuit in the light-emitting component numbered a+1; and an output end of a driving circuit in the light-emitting component numbered a is electrically connected to a first end of the cascade connection line through a first cascade via hole, a second end of the cascade connection line is electrically connected to a first end of the cascade bridge portion through a second cascade via hole, and a second end of the cascade bridge portion is electrically connected to the first end of the cascade wire through a third cascade via hole.

In some embodiments, cascade wires are arranged on the second conductive layer; a first end of the cascade wire is electrically connected to the output end of the driving circuit in the light-emitting component numbered a, and a second end of the cascade wire is electrically connected to the first input end of the driving circuit in the light-emitting component numbered a+1; the first conductive layer further includes a jumper bridge portion, and the jumper lines include a first jumper line and a second jumper line; and the first light-emitting element in the element group numbered M in the light-emitting component numbered a is electrically connected to a first end of the first jumper line, a second end of the first jumper line is electrically connected to a first end of the jumper bridge portion through a first jumper via hole, a second end of the jumper bridge portion is electrically connected to a first end of the second jumper line through a second jumper via hole, and a second end of the second jumper line is electrically connected to the driving voltage line corresponding to the light-emitting component numbered a+1.

In some embodiments, the first connectors are arranged on the second conductive layer.

In some embodiments, first connectors electrically connected to the element groups arranged on the two sides of the common voltage lines are arranged on the first conductive layer; and the common voltage lines are divided into a plurality of second line segments, the second conductive layer further includes second line segment bridge portions, gaps between second adjacent line segments in the same common voltage line are provided with the first connectors, and second adjacent line segments in the same common voltage line are electrically connected through the second line segment bridge portions.

In some embodiments, the common voltage lines are provided with avoidance areas; and orthographic projections, on the substrate, of connection pads electrically connected to light-emitting elements arranged on the two sides of the common voltage lines are positioned in orthographic projection of the avoidance areas on the substrate.

A display device provided in an embodiment of the present disclosure includes the light-emitting substrate described above.

DETAILED DESCRIPTION OF THE EMBODIMENTS

Figure 1A:
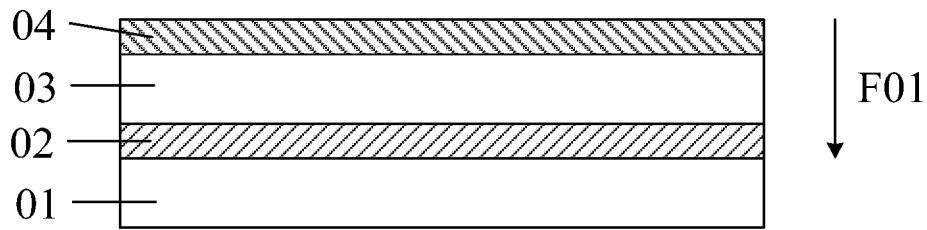
FIG. 1A is a structural schematic diagram of a light-emitting substrate in the related art.

To make the objectives, technical solutions, and advantages in the embodiments of the present disclosure more clear, the technical solutions in the embodiments of the present disclosure will be clearly and completely described below with reference to the accompanying drawings in the embodiments of the present disclosure. It is obvious that the described embodiments are some, rather than all, of the embodiments of the present disclosure. Moreover, the embodiments of the present disclosure and features in the embodiments may be combined with one another without conflict. Based on the described embodiments of the present disclosure, all other embodiments obtained by a person of ordinary skill in the art without inventive efforts fall within the scope of protection of the present disclosure.

Unless defined otherwise, technical or scientific terms used in the present disclosure should be of ordinary meaning as understood by a person of ordinary in the art to which the present disclosure pertains. Words "first", "second" etc. used in the present disclosure do not denote any order, quantity, or importance, but are merely used for distinguishing between different components. Words "comprising", "encompassing", etc, are intended to mean that an element or item in front of the word encompasses elements or items that are listed behind the word and equivalents thereof, but do not exclude other elements or items. Words "connection", "connected", etc. are not limited to a physical or mechanical connection, but may include an electrical connection, whether direct or indirect.

It should be noted that dimensions and shapes of all graphs in the accompanying drawings do not reflect true ratios, and are merely intended to illustrate contents of the present disclosure. Moreover, the same or similar reference numerals denote the same or similar elements or elements having the same or similar function throughout.

Figure 1B:
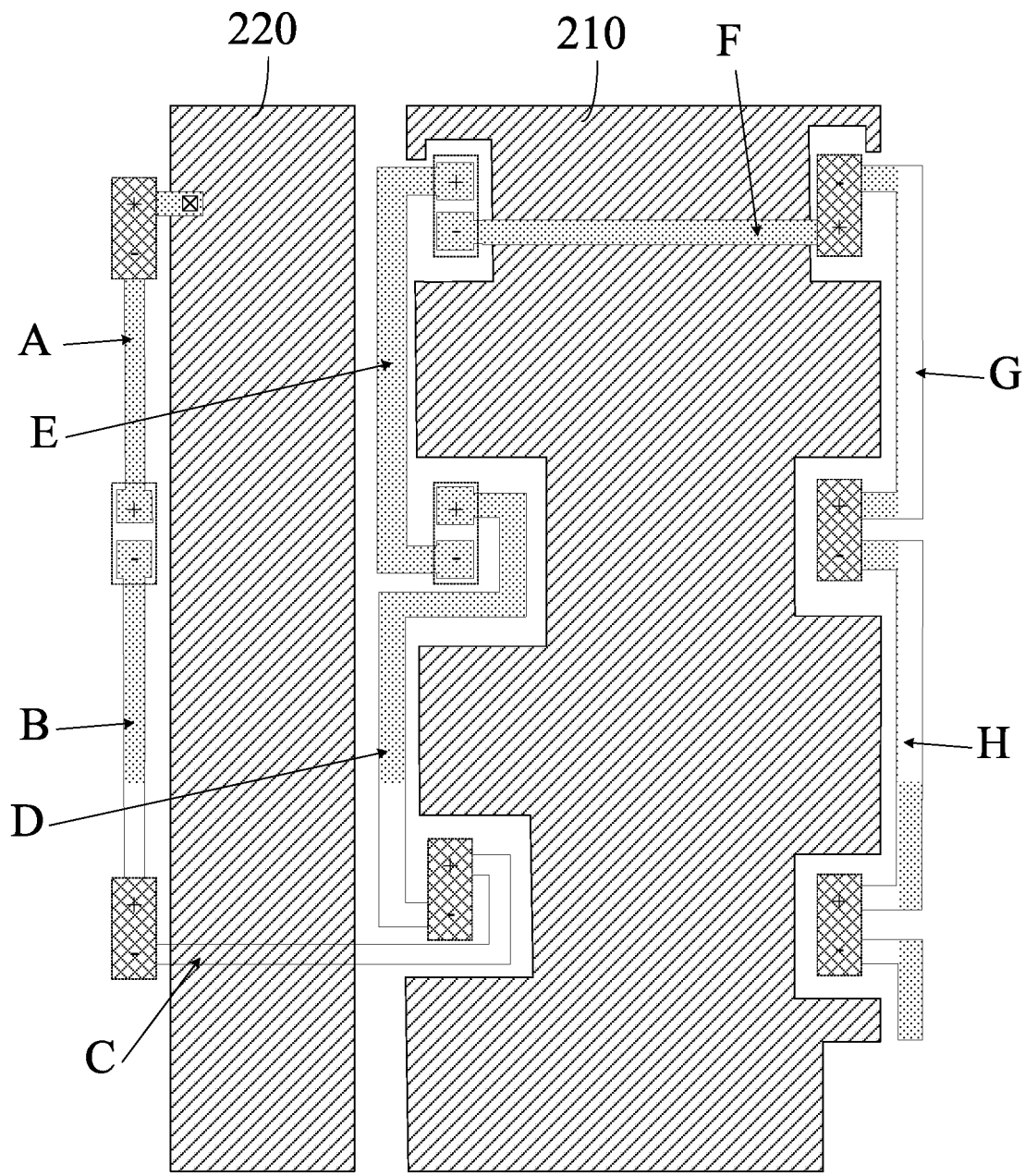
FIG. 1B is a local schematic arrangement diagram of the light-emitting substrate in the related art.

With reference to FIGS. 1A and 1B, a first conductive layer 02, an insulation layer 03, and a second conductive layer 04 are sequentially arranged on a substrate 01. The first conductive layer 02 is provided with driving voltage lines 220 and common voltage lines 210. The second conductive layer 04 is provided with metal connection lines. For example, a light-emitting component is provided with nine light-emitting elements, and the nine light-emitting elements are sequentially electrically connected in series through a metal connection line. The metal connection line among the nine light-emitting elements is divided into eight segments A, B, C, D, E, F, G, and H. For example, a voltage transmitted by the driving voltage lines 220 is 27 V, a voltage transmitted by the common voltage lines 210 is 0 V, a voltage transmitted by the segment A of the metal connection line is 24 V, a voltage transmitted by the segment B of the metal connection line is 21 V, a voltage transmitted by the segment C of the metal connection line is 18 V, a voltage transmitted by the segment D of the metal connection line is 15 V, a voltage transmitted by the segment E of the metal connection line is 12V, a voltage transmitted by the segment F of the metal connection line is 9 V, a voltage transmitted by the segment G of the metal connection line is 6 V, and a voltage transmitted by the segment H of the metal connection line is 3 V. Moreover, an orthogonal projection, on the substrate, of the segment C of the metal connection line overlaps an orthogonal projection, on the substrate, of the driving voltage lines 220, and an orthogonal projection, on the substrate, of the segment F of the metal connection line overlaps an orthogonal projection, on the substrate, of the common voltage lines 210.

Since the voltage transmitted by the segment F of the metal connection line is greater than the voltage transmitted by the common voltage lines 210, a direction of an electric field between overlapping positions between the segment F of the metal connection line and the common voltage lines 210 is directed from the second conductive layer to the first conductive layer. The second conductive layer is likely to be exposed, resulting in introduction of water and oxygen, and the first conductive layer 02 and the second conductive layer 04 are generally made of Cu with low resistance. The active Cu is likely to be corroded under the action of the electric field. A potential difference between the segment F of the metal connection line and the common voltage lines 210 forms an electrochemical corrosion anode and protective cathodes. The segment F of the metal connection line is a positive electrode to be subjected to an oxidation reaction, and the common voltage lines 210 are the cathodes to be subjected to a reduction reaction. Continuous electrochemical corrosion leads to a short circuit of contact between the segment F of the metal connection line and the common voltage lines 210. However, if electrochemical corrosion exists in the light-emitting substrate, light-emitting stability of the light-emitting substrate will be affected.

Moreover, since the voltage transmitted by the segment C of the metal connection line is lower than the voltage transmitted by the driving voltage lines 220, a direction of an electric field between overlapping positions between the segment C of the metal connection line and the driving voltage lines 220 is directed from the first conductive layer to the second conductive layer. The driving voltage lines 220 are also protected by the insulation layer 03, and far away from an invasion path of the water and the oxygen, thereby reducing the electrochemical corrosion. In view of the above, at least one embodiment of the present disclosure provides a light-emitting substrate and a display device, which reduce the influence from the electrochemical corrosion on the light-emitting substrate and improve light-emitting stability.

Figure 2:
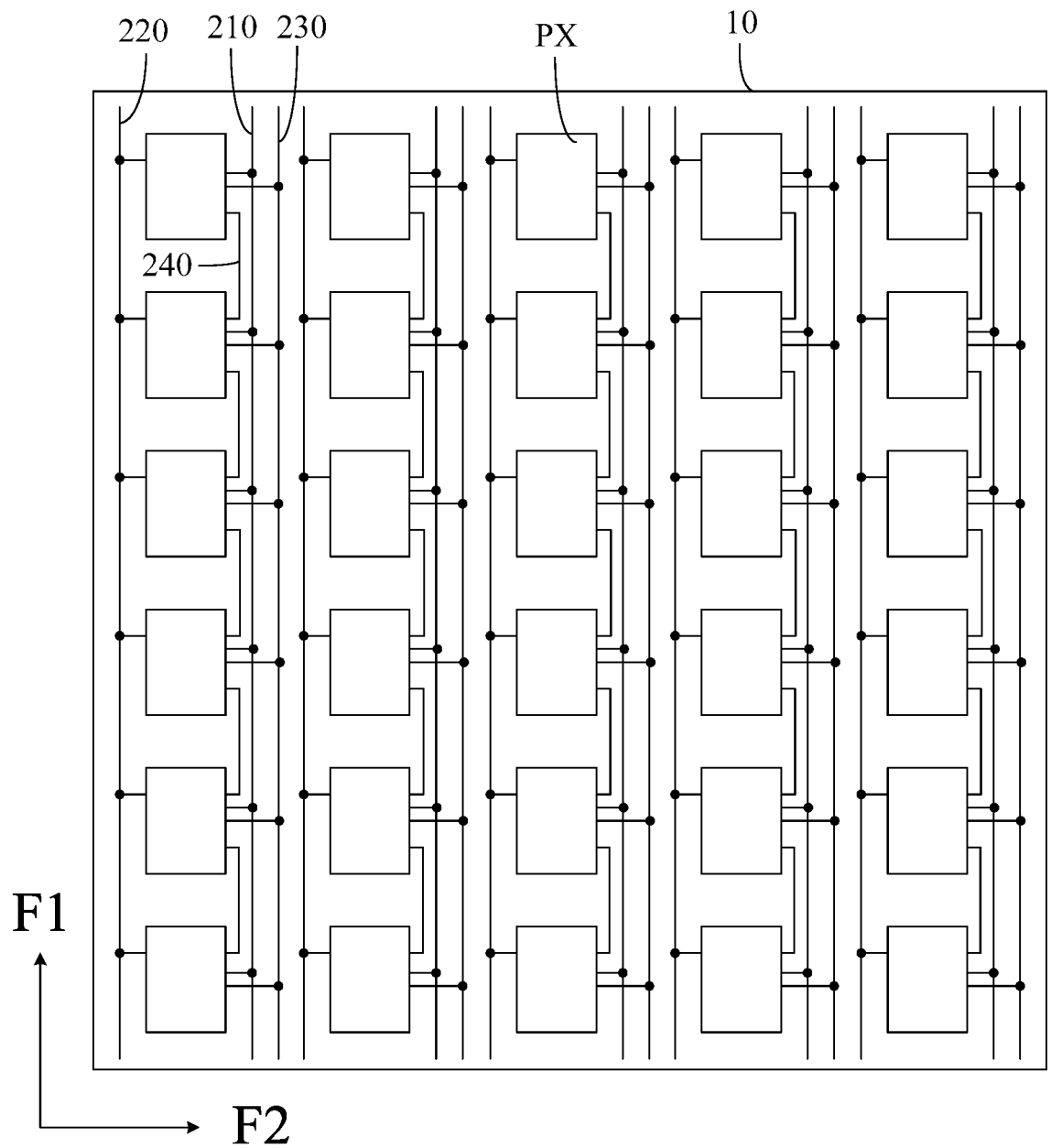
FIG. 2 is a structural schematic diagram of a light-emitting substrate in an embodiment of the present disclosure.

In some embodiments, as shown in FIG. 2, the light-emitting substrate provided by at least one embodiment of the present disclosure may include a substrate. The substrate may include a display area. Exemplarily, a material of the substrate may be selected from plastic, polyimide, silicon, ceramic, glass, quartz, etc., which is not limited in the embodiments of the present disclosure.

In some embodiments, as shown in FIG. 2, the display area may include a plurality of light-emitting components PX arranged in an array. For example, the plurality of light-emitting components PX are arranged in a plurality of rows and columns. In practical applications, the number of the light-emitting components PX may be determined according to actual requirements, such as sizes of the light-emitting substrate and required brightness. Although only 6 rows and 5 columns of light-emitting components PX are shown in FIG. 2, it should be understood that the number of the light-emitting components PX is not limited thereto.

In some embodiments, as shown in FIG. 2, in the display area, the light-emitting components PX may be arranged in the plurality of rows and columns in a first direction F1 and a second direction F2. Exemplarily, the light-emitting substrate is rectangular, the first direction F1 may be parallel to long sides of the light-emitting substrate, and the second direction F2 may be parallel to short sides of the light-emitting substrate. Alternatively, the first direction F1 may also be parallel to the short sides of the light-emitting substrate, and the second direction F2 may also be parallel to the long sides of the light-emitting substrate. Certainly, the embodiment of the present disclosure is not limited thereto, and the first direction F1 and the second direction F2 may be any directions, as long as the first direction F1 and the second direction F2 intersect each other. Moreover, the plurality of light-emitting components PX are not limited to be arranged linearly, and may also be arranged along a broken line or a ring, or in any manner, which may be determined according to actual requirements and is not limited in the embodiment of the present disclosure.

Figure 3:
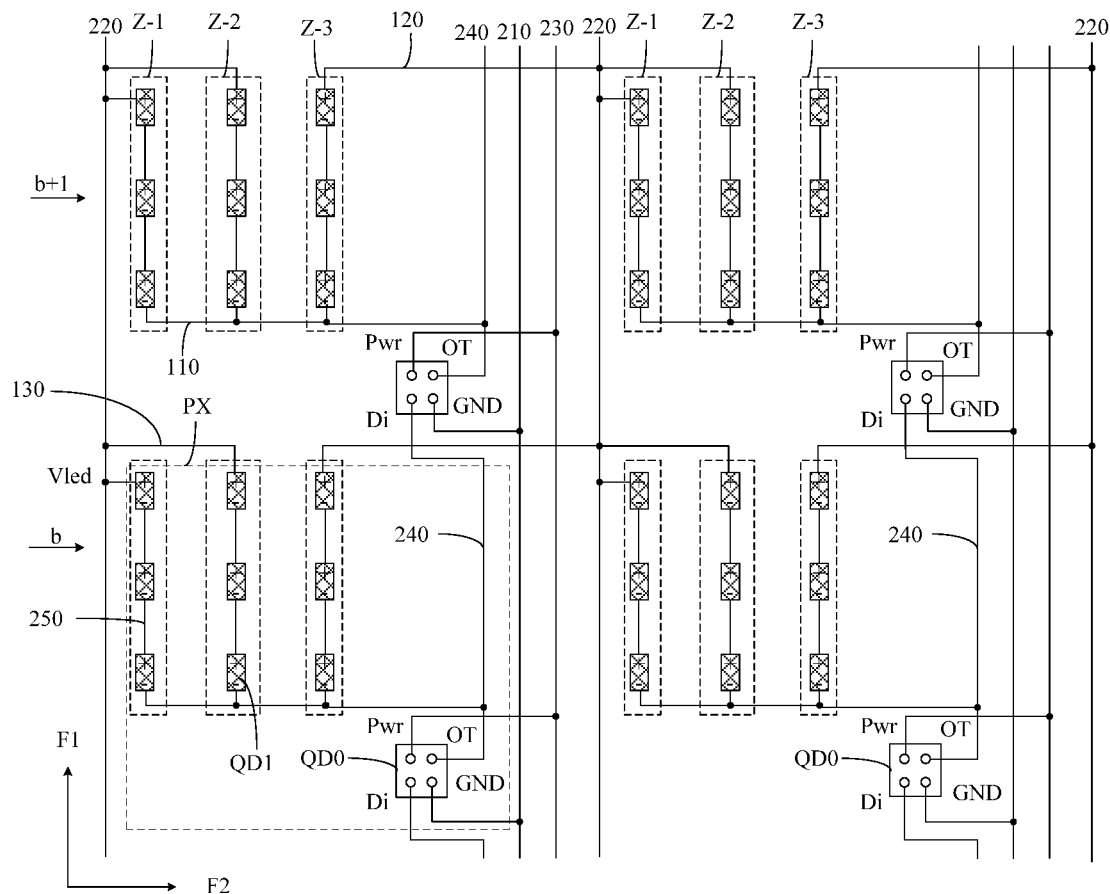
FIG. 3 is a specific local structural schematic diagram of a light-emitting substrate in an embodiment of the present disclosure.

In some embodiments, as shown in FIGS. 2 and 3, each of the light-emitting components PX may include a driving circuit QD0 and a plurality of light-emitting elements QD1. Exemplarily, the driving circuit QD0 may include a first input end Di, a second input end Pwr, an output end OT, and a common voltage end GND. During a specific implementation, in the embodiment of the present disclosure, a mini light emitting diode (Mini-LED) or a micro light emitting diode (Micro-LED) features a small dimension and high brightness, and may be applied to a display device or a backlight module thereof in a wide range, to display a high-dynamic range (HDR) by finely adjusting backlight. For example, the Micro-LED has a typical dimension (for example, a length) less than 100 microns, such as 10 microns-80 microns; and the Mini-LED has a typical dimension (for example, a length) of 80 microns-350 microns, such as 80 microns-120 microns. Exemplarily, the light-emitting elements QD1 may be at least one of the Micro-LED or the Mini-LED.

In some embodiments, during a specific implementation, the driving circuit QD0 may be configured to output, according to a first input signal received by the first input end Di and a second input signal received by the second input end Pwr, a relay signal through the output end OT in a first time period, and to form a current path with the series light-emitting elements QD1 through the output end OT in a second time period. Exemplarily, the first input end Di receives the first input signal, such as an address signal, for gating a driving circuit QD0 of a corresponding address. For example, addresses of different driving circuits QD0 may be the same or not. The first input signal may be an 8-bit address signal, and an address for a signal to be transmitted thereto may be obtained by analyzing the address signal. The second input end Pwr receives the second input signal, such as a power line carrier communication signal. For example, in addition to supplying electric energy to the driving circuit QD0, the second input signal also transmits communication data to the driving circuit QD0. The communication data may be used to control a light-emitting duration of a corresponding light-emitting component PX, thereby controlling visual light-emitting brightness thereof. The output end OT may output different signals in different time periods, such as a relay signal and a driving signal, respectively. For example, the relay signal is an address signal supplied to another driving circuit QD0, that is, a first input end Di of another driving circuit QD0 receives the relay signal as a first input signal, to obtain the address signal. For example, the driving signal may be a driving current for driving the light-emitting elements QD1 to emit light. The common voltage end GND receives a common voltage signal, for example, a grounding signal.

The driving circuit QD0 is configured to output, according to a first input signal received by the first input end Di and a second input signal received by the second input end Pwr, a relay signal through the output end OT in a first time period, and to supply a driving signal to the plurality of light-emitting elements QD1 sequentially connected in series through the output end OT in a second time period. In the first time period, the output end OT outputs the relay signal. The relay signal is supplied to another driving circuit QD0, so that another driving circuit QD0 obtains an address signal. In the second time period, the output end OT outputs the driving signal. The driving signal is supplied to the plurality of light-emitting elements QD1 sequentially connected in series, so that the light-emitting elements QD1 emit light in the second time period. For example, the first time period is different from the second time period, and the first time period may be earlier than the second time period, for example. The first time period may be continuous with the second time period, and an ending moment of the first time period is a beginning moment of the second time period. Alternatively, another time period may be provided between the first time period and the second time period, and another time period may be used to realize other required functions, or merely to separate the first time period from the second time period, to prevent the signals of the output end OT in the first time period and the second time period from interfering with each other.

It should be noted that, when the driving signal is the driving current, the driving current may flow from the output end OT to the light-emitting elements QD1, or flow from the light-emitting elements QD1 to the output end OT. A flowing direction of the driving current may be determined according to actual requirements, which is not limited in the embodiment of the present disclosure. "The output end OT outputs the driving signal" herein means that the output end OT supplies the driving signal. The driving signal may flow out from the output end OT or flow into the output end OT.

In some embodiments, during a specific implementation, as shown in FIGS. 2 and 3, relative positions of the driving circuits QD0 in the light-emitting components PX may be different or relative positions of the driving circuits QD0 in the light-emitting components PX may be the same, and relative positional relations of the light-emitting elements QD1 in each of the light-emitting components PX may be made the same. For example, the light-emitting elements may be periodically and repeatedly arranged in the first direction F1 and the second direction F2 with reference to relative positional relations of light-emitting elements QD1 in one light-emitting component PX. For example, light-emitting elements QD1 arranged at the same positions of all of the plurality of light-emitting components PX arranged in the first direction F1 may be arranged substantially in the same straight line in the first direction F1, and light-emitting elements QD1 arranged at the same positions of all of the plurality of light-emitting components PX arranged in the second direction F2 may be arranged substantially in the same straight line in the second direction F2.

In some embodiments, during a specific implementation, the driving circuit QD0 may include a demodulation circuit, a physical layer interface circuit, a data processing control circuit, a pulse width modulation circuit, a driving signal generation circuit, a relay signal generation circuit, and a power supply circuit.

Exemplarily, the demodulation circuit is electrically connected to the second input end Pwr and the physical layer interface circuit, and configured to demodulate the second input signal, to obtain the communication data, and to transmit the communication data to the physical layer interface circuit. For example, the second input signal input by the second input end Pwr is the power line carrier communication signal, where the power line carrier communication signal includes information corresponding to the communication data. For example, the communication data reflect a light-emitting duration, thereby denoting the required light-emitting brightness. Compared with a general serial peripheral interface (SPI) protocol, the embodiment of the present disclosure superimposes the communication data on a power signal through a power line carrier communication (PLC) protocol, thereby effectively reducing the number of signal lines.

Figure 4:
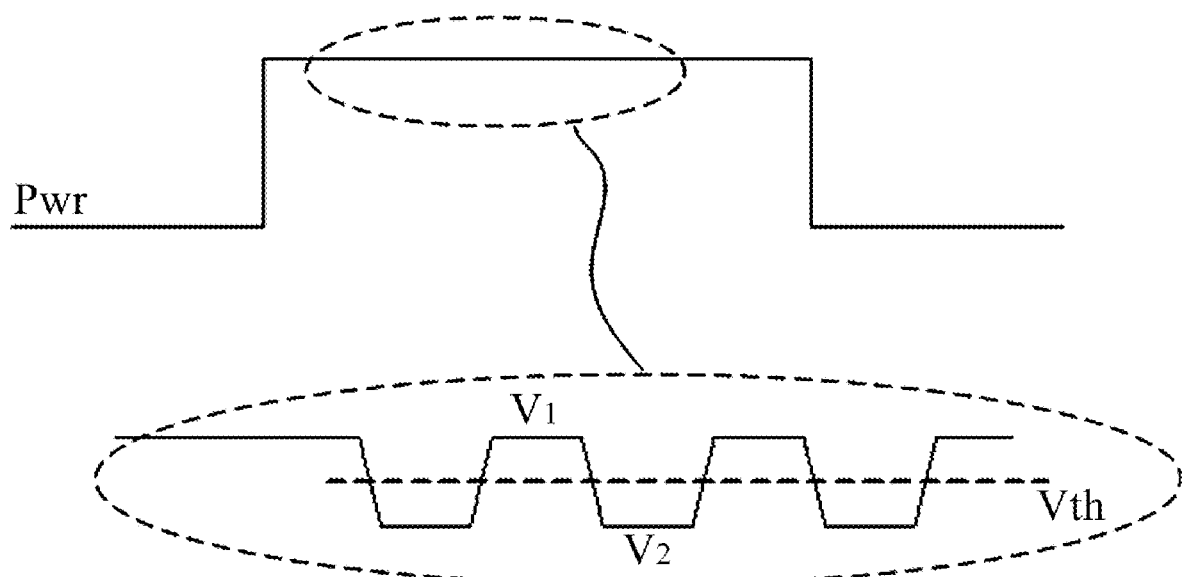
FIG. 4 is a waveform diagram of a second input signal a driving circuit provided in an embodiment of the present disclosure.

As shown in FIG. 4, a dashed oval box denotes an enlarged view of a corresponding waveform. When the second input signal is at a high level, an amplitude thereof at the high level fluctuates around a threshold amplitude Vth, for example, fluctuating between a first amplitude V1 and a second amplitude V2, V2<Vth<V1. By modulating variation rules of the first amplitude V1 and the second amplitude V2, the communication data may be modulated into the second input signal, so that the second input signal transmits the information corresponding to the communication data while transmitting the electric energy. For example, the demodulation circuit filters out direct current power components from the second input signal, to obtain the communication data. Reference may be made to a conventional power line carrier communication signal for a detailed description of the second input signal, which will not be described in detail herein. Accordingly, reference may also be made to a demodulation circuit of the conventional power line carrier communication signal for a detailed description of the demodulation circuit, which will not be described in detail herein.

Exemplarily, the physical layer interface circuit is further electrically connected to the data processing control circuit, and configured to process the communication data, to obtain data frames (for example, frame rate data), and to transmit the data frames to the data processing control circuit. The data frames obtained by the physical layer interface circuit include information required to be transmitted to the driving circuit QD0, such as information related to a light-emitting time (for example, a specific duration of the light-emitting time). For example, the physical layer interface circuit may be a general physical (PHY), and reference may be made to a conventional design for a detailed description, which will not be described in detail herein.

Exemplarily, the data processing control circuit is further electrically connected to the first input end Di, the pulse width modulation circuit, and the relay signal generation circuit. The data processing control circuit is configured to generate, based on the data frames, a pulse width control signal and transmit the pulse width control signal to the pulse width modulation circuit, and further to generate, based on the first input signal, a relay control signal and transmit the relay control signal to the relay signal generation circuit. For example, according to the data frames, a light-emitting duration required by the light-emitting elements QD1 connected to the driving circuit QD0 may be known, and a corresponding pulse width control signal is generated based on the light-emitting duration. For example, the relay control signal is generated after the data processing control circuit processes the first input signal. By processing (for example, parsing, latching, decoding, etc.) the first input signal, an address signal corresponding to the driving circuit QD0 may be known, and a relay control signal corresponding to a subsequent address will be generated, the subsequent address corresponding to another driving circuit QD0. For example, the data processing control circuit may be implemented as a single chip microcomputer, a central processing unit (CPU), a digital signal processor, etc.

Exemplarily, the pulse width modulation circuit is further electrically connected to the driving signal generation circuit, and configured to generate a pulse width modulation signal in response to the pulse width control signal, and to transmit the pulse width modulation signal to the driving signal generation circuit. For example, the pulse width modulation signal generated by the pulse width modulation circuit corresponds to the light-emitting duration required by the light-emitting elements QD1. For example, an effective pulse width duration is equal to the light-emitting duration required by the light-emitting elements QD1. For example, reference may be made to a conventional pulse width modulation circuit for a detailed description of the pulse width modulation circuit, which will not be described in detail herein.

Exemplarily, the driving signal generation circuit is further electrically connected to the output end OT, and configured to generate a driving signal in response to the pulse width modulation signal and to output the driving signal from the output end OT. Outputting the driving signal from the output end OT may mean that the driving signal (for example, a driving current) flows from the output end OT to the light-emitting elements QD1, or the driving signal (for example, a driving current) flows from the light-emitting elements QD1 into the output end OT herein, a specific current direction being not limited.

Exemplarily, in some embodiments, when the driving signal is the driving current, the driving signal generation circuit may include a current source and a metal oxide semiconductor (MOS) field effect transistor (FET), which is referred to as a MOS transistor. A control electrode of the MOS transistor receives the pulse width modulation signal transmitted by the pulse width modulation circuit, to be turned on or off under the control of the pulse width modulation signal. A first pole of the MOS transistor is connected to the output end OT, a second pole of the MOS transistor is connected to a first pole of the current source, and a second pole of the current source is connected to the common voltage end GND to receive a common voltage. For example, the current source may be a constant current source.

When the pulse width modulation signal is at a valid level, the MOS transistor is turned on, and the current source supplies a driving current through the output end OT. When the pulse width modulation signal is at an invalid level, the MOS transistor is turned off, and the output end OT doe not supply a driving current in this case. A duration of the valid level of the pulse width modulation signal is equal to a duration by which the MOS transistor is turned on, which is equal to a duration for the output end OT to supply the driving current. Therefore, it is possible to further control the light-emitting duration of the light-emitting elements QD1, thereby controlling the visual light-emitting brightness. For example, in some examples, when the MOS transistor is turned on, the driving current flows into the driving circuit QD0 from the OT end, and flows through the MOS transistor and the current source sequentially, and finally flows into a grounding end (for example, the common voltage end GND). It should be noted that, in the embodiment of the present disclosure, the driving signal generation circuit may also be in other circuit structure forms, which is not limited in the embodiment of the present disclosure.

Exemplarily, the relay signal generation circuit is further electrically connected to the output end OT, and configured to generate, based on the relay control signal, a relay signal and to output the relay signal from the output end OT. For example, the relay control signal corresponds to the subsequent address, and the relay signal generated based on the relay control signal includes the subsequent address corresponding to another driving circuit QD0. After being output from the output end OT, the relay signal is supplied to a first input end Di of a separately-provided driving circuit QD0, and the relay signal is input as a first input signal to the separately-provided driving circuit QD0, so that the separately-provided driving circuit QD0 acquires a corresponding address signal. The relay signal generation circuit may be implemented through a latch, a decoder, an encoder, etc., which is not limited in the embodiment of the present disclosure.

It should be noted that, in the embodiment of the present disclosure, although the driving signal generation circuit and the relay signal generation circuit are both electrically connected to the output end OT, the driving signal generation circuit and the relay signal generation circuit output the driving signal and the relay signal at different time periods respectively, and the driving signal and the relay signal are transmitted in a time-sharing manner through the output end OT, thereby avoiding affecting each other.

Exemplarily, the power supply circuit is electrically connected to the demodulation circuit and the data processing control circuit, respectively, and configured to receive electric energy and supply the electric energy to the data processing control circuit. For example, after the second input signal, which is the power line carrier communication signal, is demodulated through the demodulation circuit, the direct current power components (for example, the electric energy) in the second input signal are transmitted to the power supply circuit, and then supplied to the data processing control circuit through the power supply circuit. Certainly, the embodiment of the present disclosure is not limited thereto, and the power supply circuit may also be electrically connected to other circuits in the driving circuit QD0 to supply the electric energy. The power supply circuit may be implemented through a switch circuit, a voltage conversion circuit, a voltage stabilization circuit, etc., which is not limited in the embodiment of the present disclosure.

It should be noted that, in the embodiment of the present disclosure, the driving circuit QD0 may further include more circuits and components, which are not limited to the demodulation circuit, the physical layer interface circuit, the data processing control circuit, the pulse width modulation circuit, the driving signal generation circuit, the relay signal generation circuit, and the power supply circuit described above, which may be determined according to functions to be realized, and is not limited in the embodiment of the present disclosure.

Figure 5:
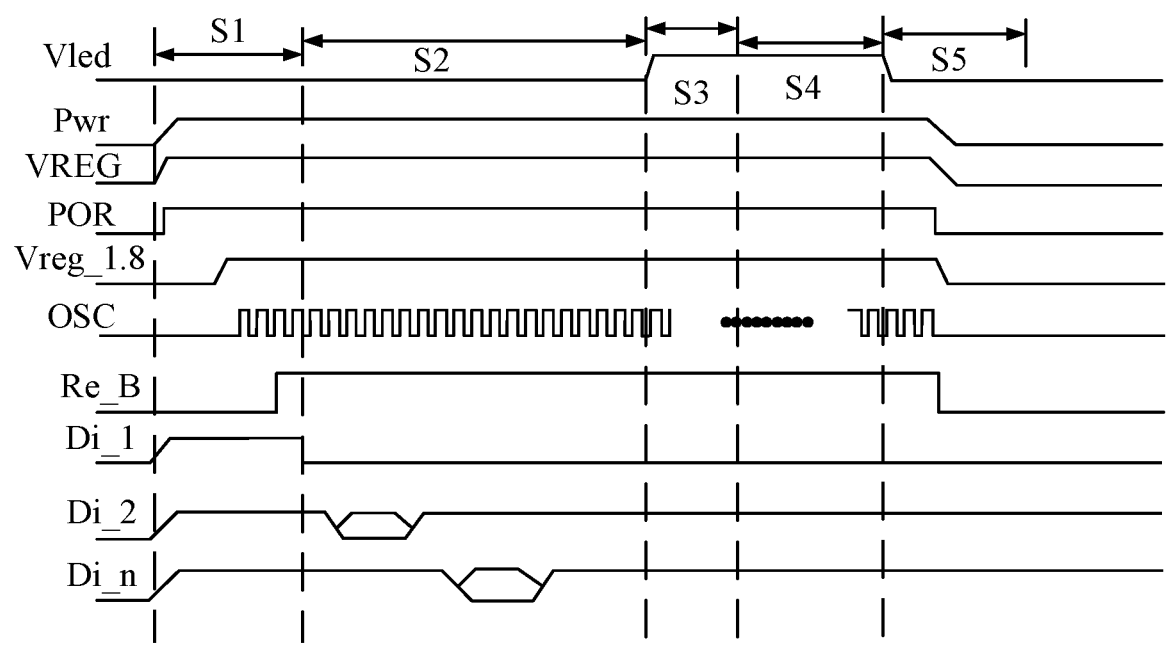
FIG. 5 is a signal timing diagram of a driving circuit provided in an embodiment of the present disclosure.

As shown in FIG. 5, during working, the driving circuit QD0 is electrified (that is, powered on) first to be initialized, and then carries out an address writing operation in a time period S1, that is, in the time period S1, a first input signal Di_1 is input into the driving circuit QD0 through the first input end Di, to write in an address. For example, the first input signal Di_1 is sent by a separately-provided sender.

Next, in a time period S2, the driving circuit QD0 carries out driving configuration, and outputs a relay signal Di_2 through the output end OT. For example, the relay signal Di_2 is input as a first input signal to a first input end Di of a separately-provided driving circuit QD0. For example, the foregoing first time period is the time period S2.

Then, in a time period S3, the driving circuit QD0 electrifies the driving voltage lines 220. For example, after a plurality of driving circuits QD0 all acquire corresponding addresses, the time period S3 is entered after an interval of about 10 microseconds. In this case, a driving voltage supplied by the driving voltage lines 220 is turned to be at a high level.

Next, in a time period S4, the driving circuit QD0 is in a normal working mode, and the output end OT supplies, according to the required duration, the driving signal (for example, the driving current), so that the light-emitting elements QD1 connected to the driving circuit QD0 emits light according to the required duration. For example, the foregoing second time period is the time period S4. For example, when serving as a backlight unit of a display device, the light-emitting substrate using the driving circuit QD0 works in a local dimming mode, thereby realizing a high dynamic range effect.

Finally, in a time period S5, a system is turned off, that is, the driving circuit QD0 is powered off, and the driving voltage supplied by the driving voltage lines 220 is turned to be at a low level, and the light-emitting elements QD1 stop emitting light.

It should be noted that the working flow described above is merely illustrative and not restrictive. An actual working flow of the driving circuit QD0 may be determined according to actual requirements, which is not limited in the embodiment of the present disclosure. In FIG. 5, VREG, POR, Vreg_1.8, OSC, and Re_B are all internal signals of the driving circuit QD0, and will not be input or output through the first input end Di, the second input end Pwr, the output end OT, and the common voltage end GND. Di_1 is the first input signal received by the driving circuit QD0, Di_2 is the relay signal output by the driving circuit QD0 (that is, a first input signal received by a next driving circuit QD0 connected thereto), and Di_n is a first input signal received by an $n^{th}$ driving circuit QD0 among the plurality of driving circuits QD0 sequentially connected.

Exemplarily, during a specific implementation, the driving circuit QD0 may be configured as a chip having a chip dimension (for example, a length) of dozens of microns and a chip area about hundreds of square microns or even smaller. Therefore, the driving circuit has a similar dimension with the Mini-LED, thereby being miniaturized, so that the driving circuit is integrated into the light-emitting substrate (for example, bounded to a surface of the light-emitting substrate) conveniently, thereby omitting an arrangement space of a printed circuit board, and simplifying a structure, which are conducive to a light and thin substrate. Each of the driving circuits QD0 directly drives one light-emitting component PX, thereby avoiding complex operations, a tendency of flickers, etc. of a row scanning control method. Moreover, the driving circuit QD0 has a few ports and a few required signals, resulting in a simple control method, a simple routing method, and a low cost.

Figure 6:
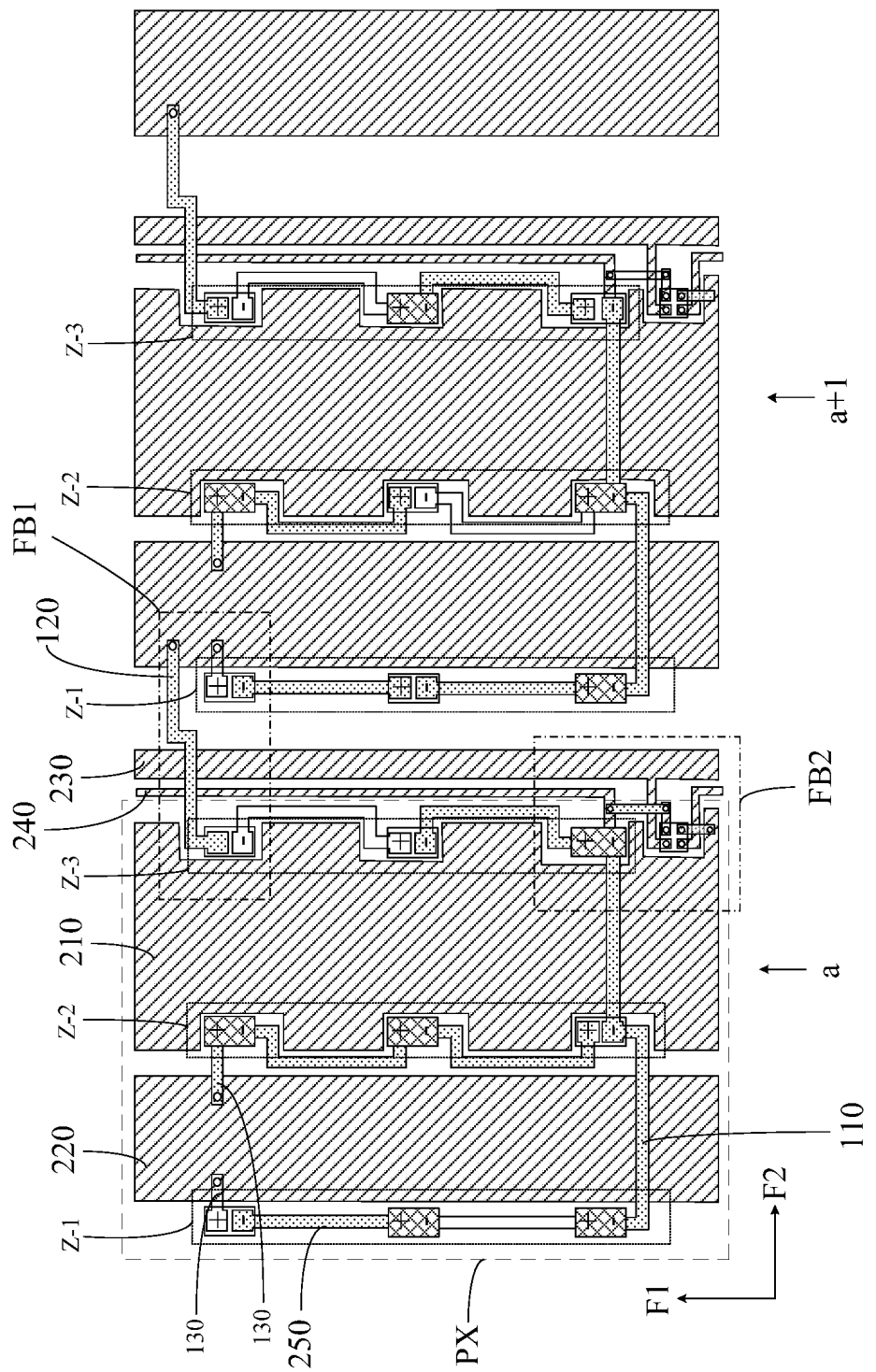
FIG. 6 shows some local schematic arrangement diagrams of a light-emitting substrate in an embodiment of the present disclosure.
Figure 7A:
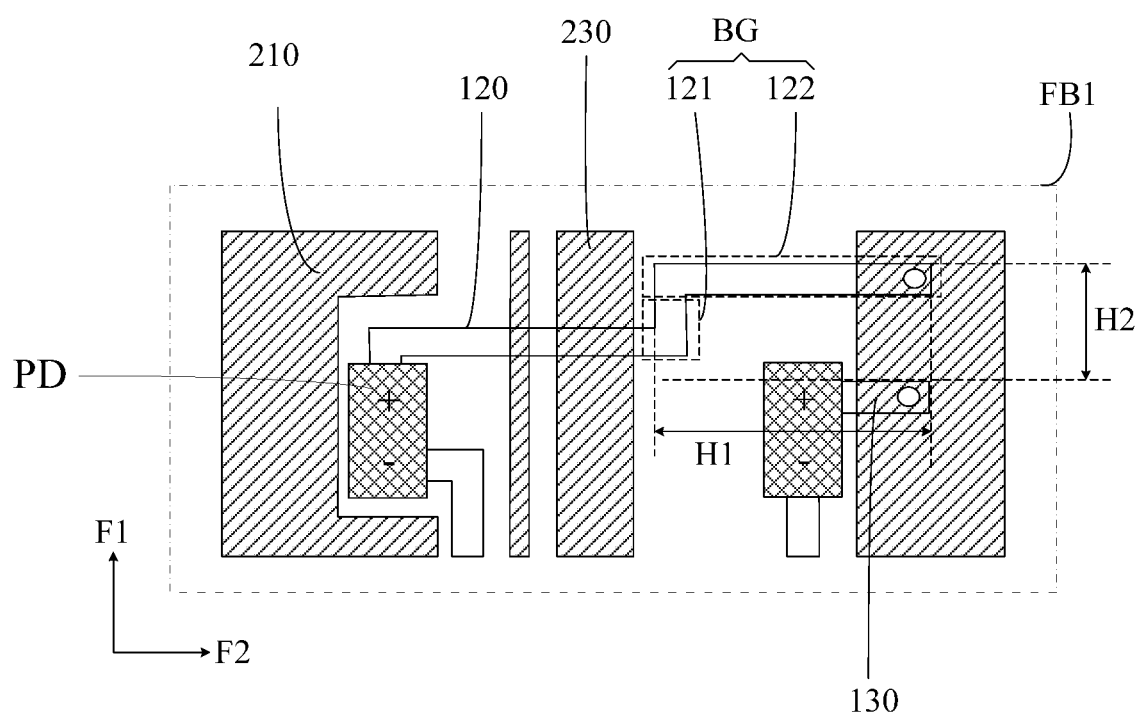
FIG. 7A is an enlarged schematic arrangement diagram of an area FB1 in FIG. 6.
Figure 7B:
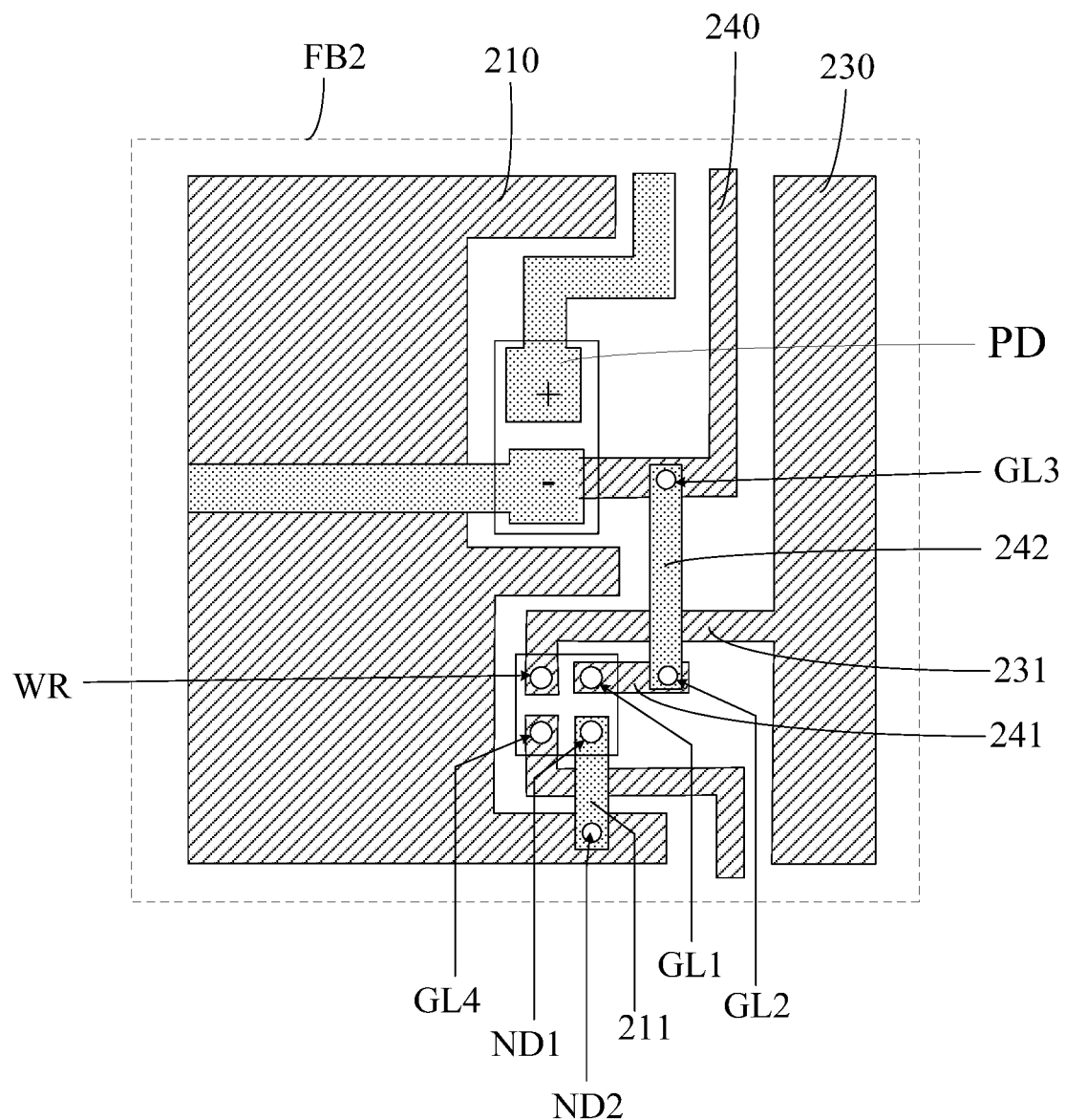
FIG. 7B is an enlarged schematic arrangement diagram of an area FB2 in FIG. 6.

During a specific implementation, in the embodiment of the present disclosure, as shown in FIGS. 6-7B, a buffer 400 is arranged on the substrate, to increase an adhesive force of the first conductive layer. The first conductive layer is arranged on one side, away from the substrate, of the buffer 400. Exemplarily, the first conductive layer may include: a plurality of common voltage lines 210, a plurality of driving voltage lines 220, a plurality of source voltage lines 230 arranged at intervals. Exemplarily, one column of the light-emitting components PX may correspond to one common voltage line 210, one source voltage line 230, and one driving voltage line 220. Exemplarily, the plurality of common voltage lines 210, the plurality of driving voltage lines 220, and the plurality of source voltage lines 230 extend in the first direction F1, respectively. Moreover, the plurality of common voltage lines 210, the plurality of driving voltage lines 220, and the plurality of source voltage lines 230 are arranged in the second direction F2, respectively. Exemplarily, the driving voltage lines 220, the common voltage lines 210, and the source voltage lines 230 may be repeatedly arranged in the second direction F2 in an order of the driving voltage lines, the common voltage lines, and the source voltage lines. For example, for a common voltage line 210, a source voltage line 230, and a driving voltage line 220 corresponding to each column of the light-emitting components PX: an orthographic projection, on the substrate, of the common voltage line 210 is arranged between the driving voltage line 220 and the source voltage line 230.

Exemplarily, the source voltage line 230 is electrically connected to the second input ends Pwr of the driving circuits QD0. In this way, the second input signal may be transmitted to the second input ends Pwr of the driving circuits QD0 through the source voltage line 230. In some embodiments, second input ends Pwr of driving circuits QD0 of one column of the light-emitting components PX are all electrically connected to the same source voltage line 230.

For example, the common voltage line 210 is electrically connected to the common voltage ends GND of the driving circuits QD0, so that the voltage on the common voltage line 210 is the grounding voltage, to supply a grounding voltage signal to the common voltage ends of the driving circuits QD0 through the common voltage line 210. In some embodiments, common voltage ends GND of driving circuits QD0 of one column of the light-emitting components PX are all electrically connected to the same common voltage line 210.

It should be noted that, by making extending directions of most signal lines in the first conductive layer consistent, a routing space may be rationally designed, and signal interference may be reduced.

In some embodiments, during a specific implementation, as shown in FIGS. 3 and 6, for a common voltage line 210, a driving voltage line 220, and a source voltage line 230 corresponding to one column of the light-emitting components PX: the common voltage line 210 is arranged between the driving voltage line 220 and the source voltage line 230. Exemplarily, a width, in the second direction F2, of the driving voltage line 220 is greater than a width, in the second direction F2, of the source voltage line 230. The width, in the second direction F2, of the source voltage line 230 is greater than a width, in the second direction F2, of a cascade wire 240.

In some embodiments, the first conductive layer may be made of a metal material to form a single-layer structure. Alternatively, the first conductive layer may also be made of a metal material to form a laminated structure. For example, the first conductive layer made of two layers of metal materials is used, where the first conductive layer is provided with a layer C-1 and a layer C-2. Exemplarily, the metal material may include, but is not limited to, Cu.

During a specific implementation, in the embodiment of the present disclosure, the first insulation layer is formed on the first conductive layer, that is, the first insulation layer is arranged on one side, away from the substrate, of the first conductive layer. Exemplarily, the first insulation layer may form a single-layer structure made of an inorganic material, an organic material, or an organic-inorganic composite. Alternatively, the first insulation layer may also be of a multilayer structure made of at least one of an inorganic material, an organic material, or an organic-inorganic composite. For example, the first insulation layer may be made of a plurality of layers of organic materials. Alternatively, the first insulation layer may also be made of a plurality of layers of inorganic materials. Alternatively, the first insulation layer may also be made of an organic material and an inorganic material arranged in a laminated manner. Exemplarily, the first insulation layer may include a first insulation sub-layer and a second insulation sub-layer, where the second insulation sub-layer may be made of an organic material, and the first insulation sub-layer may be made of an inorganic material. Exemplarily, the inorganic material may be selected from at least one of silicon nitride (SiNx), silicon oxide (SiOX), silicon oxynitride (SiON), etc. The organic material may be polyimide (PI) or the like.

In some embodiments, during a specific implementation, as shown in FIGS. 6-7B, the second conductive layer is formed on the first insulation layer, that is, the second conductive layer is arranged on one side, away from the substrate, of the first insulation layer. A second insulation layer is formed on the second conductive layer, that is, the second insulation layer is arranged on one side, away from the substrate, of the second conductive layer. The light-emitting elements QD1 are formed on the second insulation layer. Exemplarily, the second insulation layer may form a single-layer structure made of an inorganic material, an organic material, or an organic-inorganic composite. Alternatively, the second insulation layer may also be of a multilayer structure made of at least one of an inorganic material, an organic material, or an organic-inorganic composite. For example, the second insulation layer may be made of a plurality of layers of organic materials. Alternatively, the second insulation layer may also be made of a plurality of layers of inorganic materials. Alternatively, the second insulation layer may also be made of an organic material and an inorganic material arranged in a laminated manner. Exemplarily, the second insulation layer may include a third insulation sub-layer and a fourth insulation sub-layer. The fourth insulation sub-layer may be made of an organic material, and the third insulation sub-layer may be made of an inorganic material. Exemplarily, the inorganic material may be selected from at least one of silicon nitride (SiNx), silicon oxide (SiOX), silicon oxynitride (SiON), etc. The organic material may be polyimide (PI) or the like.

Exemplarily, the second conductive layer may include: a plurality of connection pads (for example, PDs), and a plurality of cascade wires 240 spaced from one another. Exemplarily, the plurality of cascade wires 240 extend in the first direction F1. For example, in the first direction F1, the driving circuits QD0 of one column of the light-emitting components PX may be coupled to one another, and the driving circuits QD0 of adjacent ones in one column of the light-emitting components PX are coupled through the cascade wires 240. For example, a first row to a sixth row are defined in a direction indicated by an arrow of the first direction F1. A first column to a fifth column are defined in a direction indicated by an arrow of the second direction F2. For example, in the first column, output ends of driving circuits QD0 of a first row of the light-emitting components PX are coupled to first input ends Di of driving circuits QD0 of a second row of the light-emitting components PX through one cascade wire 240; output ends of the driving circuits QD0 of the second row of the light-emitting components PX are coupled to first input ends Di of driving circuits QD of a third row of the light-emitting components PX through one cascade wire 240; output ends of the driving circuits QD0 of the third row of the light-emitting components PX are coupled to first input ends Di of driving circuits QD0 of a fourth row of the light-emitting components PX through one cascade wire 240; output ends of the driving circuits QD0 of the fourth row of the light-emitting components PX are coupled to first input ends Di of driving circuits QD0 of a fifth row of the light-emitting components PX through one cascade wire 240; output ends of the driving circuits QD0 of the fifth row of the light-emitting components PX are coupled to first input ends Di of driving circuits QD0 of a sixth row of the light-emitting components PX through one cascade wire 240; and output ends of the driving circuits QD0 of the sixth row of the light-emitting components PX are coupled to cascade output ends through one cascade output wire. In this way, cascade directions between the cascade wires 240 and the driving circuits QD0 may be consistent, so that a signal overlapping area is reduced, and signal interference is reduced.

During a specific implementation, in the embodiment of the present disclosure, as shown in FIGS. 7A and 7B, one electrode of the light-emitting element is electrically connected to one connection pad PD. For example, a positive electrode of the light-emitting element QD1 is electrically connected to one connection pad PD, and a negative electrode of the light-emitting element QD1 is electrically connected to another connection pad PD. Connection pads PD corresponding to light-emitting elements QD1 arranged in series may be electrically connected through a series wire 250. Connection pads PD corresponding to light-emitting elements QD1 arranged in parallel may be electrically connected through first connectors 110. The rest may be arranged in the same manner, which is not described in detail herein.

During a specific implementation, in the embodiment of the present disclosure, the plurality of light-emitting elements QD1 of the light-emitting components PX may be divided into a plurality of element groups. In the same light-emitting component PX, at least two element groups are electrically connected to different driving voltage lines 220. Exemplarily, the plurality of light-emitting elements QD1 of the light-emitting components PX are divided into M element groups, where each of the element groups includes N light-emitting elements QD1 arranged in the first direction F1, the M element groups are arranged in the second direction F2, N is an integer greater than 0, and M is an integer greater than 0. For example, as shown in FIGS. 3 and 6, for example, the light-emitting component PX includes nine light-emitting elements QD1, M=3, and N=3, the nine light-emitting elements QD1 may be divided into three element groups Z-1, Z-2, and Z-3. The element groups Z-1, Z-2, and Z-3 are arranged in the second direction F2. Moreover, the element group Z-1 is provided with three light-emitting elements QD1 arranged in the first direction F1, the element group Z-2 is also provided with three light-emitting elements QD1 arranged in the first direction F1, and the element group Z-3 is also provided with three light-emitting elements QD1 arranged in the first direction F1. In the same light-emitting component PX, the element group Z-1 and the element group Z-2 are connected to a driving voltage line 220 arranged on a left side of the light-emitting component PX, and the element group Z-3 is connected to a driving voltage line 220 arranged on a right side of the light-emitting component PX. In this way, an overlapping area between the second conductive layer and the common voltage lines 210 may be reduced.

During a specific implementation, in the embodiment of the present disclosure, as shown in FIG. 6, one light-emitting component PX may be connected to two driving voltage lines 220, an orthographic projection, on the substrate, of one driving voltage line 220 220 of the two driving voltage lines 220 overlaps an orthographic projection, on the substrate, of the light-emitting component PX, and an orthographic projection, on the substrate, of the other driving voltage line 220 does not overlap the orthographic projection, on the substrate, of the light-emitting component PX. For example, for second to $(N-1)^{th}$ driving voltage lines 220: these driving voltage lines 220 are electrically connected to two adjacent columns of the light-emitting components PX, respectively. In this way, loads on the second to $(N-1)^{th}$ driving voltage lines 220 may be substantially the same, thereby improving light-emitting stability. N is the total number of the driving voltage lines in the light-emitting substrate. In practical applications, a value of N may be designed and determined according to requirements of the practical applications, which is not limited herein.

It should be noted that N driving voltage lines 220 are arranged on the light-emitting substrate, and the plurality of driving voltage lines 220 arranged on the light-emitting substrate may be defined and numbered in the direction indicated by the arrow of the second direction F2: a first driving voltage line 220 (for example, a leftmost driving voltage line 220), a second driving voltage line 220, . . . , an $(N-1)^{th}$ driving voltage line 220, and an $N^{th}$ driving voltage line 220 (for example, a rightmost driving voltage line 220).

During a specific implementation, in the embodiment of the present disclosure, as shown in FIG. 6, the number of light-emitting components PX electrically connected to each of the second driving voltage line to the $(N-1)^{th}$ driving voltage line 220 may be the same. In this way, the loads on the second driving voltage line to the $(N-1)^{th}$ driving voltage line 220 may be further substantially the same, thereby further improving the light-emitting stability and further reducing a design difficulty of the light-emitting components PX.

During a specific implementation, in the embodiment of the present disclosure, as shown in FIG. 6, the number of element groups electrically connected to each of the second driving voltage line to the $(N-1)^{th}$ driving voltage line 220 may be the same. In this way, the loads on the second driving voltage line to the $(N-1)^{th}$ driving voltage line 220 may be further substantially the same, thereby further improving the light-emitting stability and further reducing a design difficulty of the element groups.

During a specific implementation, in the embodiment of the present disclosure, as shown in FIG. 6, the number of light-emitting elements QD1 electrically connected to the second driving voltage line to the $(N-1)^{th}$ driving voltage line 220 may be the same. In this way, the loads on the second driving voltage line to the $(N-1)^{th}$ driving voltage line 220 may be further substantially the same, thereby further improving the light-emitting stability and further reducing a design difficulty of the light-emitting elements QD1.

During a specific implementation, in the embodiment of the present disclosure, as shown in FIGS. 3 and 6, different element groups may be arranged in parallel in the same light-emitting component PX. Exemplarily, voltages on two ends of the element groups Z-1, Z-2, and Z-3 are all the same. For example, in the same light-emitting component PX, different element groups may be arranged in parallel through the first connectors. Exemplarily, positions with the lowest voltage of the element groups Z-1, Z-2, and Z-3 are arranged in parallel through the first connectors. That is, in the same light-emitting component, parallel connection positions have the lowest voltage.

During a specific implementation, in the embodiment of the present disclosure, as shown in FIG. 6, in the same light-emitting component PX, last light-emitting elements QD1 in different element groups may be electrically connected to the output end of the driving circuit QD0. Exemplarily, in the same light-emitting component PX, the last light-emitting elements QD1 in different element groups may be arranged in parallel through the first connectors 110. That is to say, in the same light-emitting component PX, the last light-emitting elements QD1 in different element groups may be electrically connected to the output end of the driving circuit QD0 through the first connectors 110. For example, a last light-emitting element QD1 in the element group Z-1 is electrically connected to a last light-emitting element QD1 in the element group Z-2 through a first connector 110, and the last light-emitting element QD1 in the element group Z-2 is electrically connected to a last light-emitting element QD1 in the element group Z-3 through a first connector 110. The last light-emitting element QD1 in the element group Z-3 is directly electrically connected to the output end of the driving circuit QD0. Exemplarily, the first connectors 110 may be arranged on the second conductive layer.

During a specific implementation, in the embodiment of the present disclosure, in the same light-emitting component PX, the last light-emitting elements QD1 in different element groups are electrically connected to the lowest voltage, so that a current flowing path in each of the element groups is to the last light-emitting elements QD1 electrically connected to the output end of the driving circuit QD0. For example, the last light-emitting element QD1 in the element group Z-1 is electrically connected to the lowest voltage. The last light-emitting element QD1 in the element group Z-2 is electrically connected to the lowest voltage. The last light-emitting element QD1 in the element group Z-3 is electrically connected to the lowest voltage.

During a specific implementation, in the embodiment of the present disclosure, in the same light-emitting component PX, electrodes of the light-emitting elements QD1 arranged in parallel in different element groups are of the same type. For example, a positive electrode of a first light-emitting element QD1 in the element group Z-1, a positive electrode of a first light-emitting element QD1 in the element group Z-2, and a positive electrode of a first light-emitting element QD1 in the element group Z-3 are arranged in parallel. A negative electrode of the last light-emitting element QD1 in the element group Z-1, a negative electrode of the last light-emitting element QD1 in the element group Z-2, and a negative electrode of the last light-emitting element QD1 in the element group Z-3 are arranged in parallel.

During a specific implementation, in the embodiment of the present disclosure, a voltage on the first connectors 110 may be lower than or equal to the voltage on the common voltage lines 210.

During a specific implementation, in the embodiment of the present disclosure, voltage on the first connectors 110 may be lower than or equal to the voltage on the driving voltage lines 220.

During a specific implementation, in the embodiment of the present disclosure, as shown in FIG. 6, in the same element group, light-emitting elements QD1 are arranged in series. Exemplarily, the second conductive layer may further include: a plurality of element wires 250 spaced from one another. In each of the element groups, two adjacent light-emitting elements QD1 are electrically connected through an element wire 250. For example, each of the light-emitting elements QD1 includes a positive electrode (+) and a negative electrode (−) (alternatively, referred to as an anode and a cathode). In the same element group, positive electrodes and negative electrodes of the light-emitting elements QD1 are sequentially connected in series end to end between the driving voltage line 220 and the output end OT, so that a current flowing path is formed between the driving voltage line 220 and the output end OT. For example, positive electrodes and negative electrodes of the light-emitting elements QD1 in the element group Z-1 are sequentially connected in series end to end between the driving voltage line 220 and the output end OT, that is, a light-emitting element QD1 electrically connected to the driving voltage line 220 is used as a starting point of a series connection of the three light-emitting elements QD1 in the element group Z-1, and a light-emitting element QD1 electrically connected to the output end OT is used as an ending point of the series connection of the three light-emitting elements QD1 in the element group Z-1. Positive electrodes and negative electrodes of the light-emitting elements QD1 in the element group Z-2 are sequentially connected in series end to end between the driving voltage line 220 and the output end OT, that is, a light-emitting element QD1 electrically connected to the driving voltage line 220 is used as a starting point of a series connection of the three light-emitting elements QD1 in the element group Z-2, and a light-emitting element QD1 electrically connected to the output end OT is used as an ending point of the series connection of the three light-emitting elements QD1 in the element group Z-2. Positive electrodes and negative electrodes of the light-emitting elements QD1 in the element group Z-3 are sequentially connected in series end to end between the driving voltage line 220 and the output end OT, that is, a light-emitting element QD1 electrically connected to the driving voltage line 220 is used as a starting point of a series connection of the three light-emitting elements QD1 in the element group Z-3, and a light-emitting element QD1 electrically connected to the output end OT is used as an ending point of the series connection of the three light-emitting elements QD1 in the element group Z-3.

Moreover, second connectors 130 corresponding to the element groups Z-1 and Z-2 are connected to a left driving voltage line 220, and second connectors 130 corresponding to the element group Z-3 are connected to a right driving voltage line 220. In practical applications, the driving voltage lines 220 may supply a driving voltage. For example, a high voltage in a time period (the second time period) in which the light-emitting elements QD1 are required to emit light, and a low voltage in other time periods are provided. Therefore, in the second period, the driving signal (for example, the driving current) flows from the driving voltage lines 220 to the light-emitting elements QD1 of each of the element groups sequentially, and then into the output end OT of the driving circuit QD0. Moreover, the light-emitting elements QD1 emits light when the driving current flows therethrough. By controlling a duration of the driving current, the light-emitting duration of the light-emitting elements QD1 may be controlled, thereby controlling the visual light-emitting brightness.

Certainly, a connection method among the light-emitting elements QD1 in the element groups may be that some of the light-emitting elements QD1 are connected in parallel and then in series. Alternatively, a connection method among the light-emitting elements QD1 in the element groups may include that some of the light-emitting elements QD1 are connected in series and then in parallel. In practical applications, the connection method may be designed and determined according to actual requirements, which is not limited herein.

It should be noted that, in the embodiment of the present disclosure, the number of the light-emitting elements QD1 of each of the light-emitting components PX is not limited, and may be any of 6, 8, 12, etc., instead of being limited to 9. The plurality of light-emitting elements QD1 may be arranged randomly, for example, in a required pattern, and are not limited to a matrix. Moreover, the driving circuits QD0 are not subjected to the limitation on arrangement positions, and may be arranged in any gaps between the light-emitting elements QD1, which may be determined according to actual requirements, and is not limited in the embodiment of the present disclosure.

During a specific implementation, in the embodiment of the present disclosure, as shown in FIG. 6, first hollowed-out gaps are provided between driving voltage line 220s and common voltage lines 210 adjacent to each other, second hollowed-out gaps are provided between common voltage lines 210 and source voltage lines 230 adjacent to each other, and third hollowed-out gaps are provided between source voltage lines 230 and driving voltage lines 220 adjacent to each other. The first hollowed-out gaps, the second hollowed-out gaps, and the third hollowed-out gaps are each provided with one element group in one column of the light-emitting components PX and element wires 250 connected between adjacent light-emitting elements QD1 in the element group. Exemplarily, element groups Z-2 are arranged in the first hollowed-out gaps, element groups Z-3 are arranged in the second hollowed-out gaps, and element groups Z-1 are arranged in the third hollowed-out gaps.

During a specific implementation, in the embodiment of the present disclosure, as shown in FIG. 6, different element groups are arranged on the two sides of the common voltage lines 210; and the element groups arranged on the two sides of the common voltage lines 210 are electrically connected to different driving voltage lines 220. Exemplarily, two element groups of the same light-emitting component PX are arranged on two sides of one common voltage line 210, for example, an element group Z-2 is arranged on one side, facing the driving voltage line 220, of the common voltage line 210, and an element group Z-3 is arranged on one side, facing the source voltage line 230, of the common voltage line 210. Moreover, the element group Z-2 arranged on one side, facing the driving voltage line 220, of the common voltage line 210 is electrically connected to a driving voltage line 220 arranged on one side, away from the source voltage line 230, of the common voltage line 210, and the element group Z-3 arranged on one side, facing the source voltage line 230, of the common voltage line 210 is electrically connected to a driving voltage line 220 arranged on one side, away from the common voltage line 210, of the source voltage line 230.

During a specific implementation, in the embodiment of the present disclosure, as shown in FIG. 6, in the second direction F2, one driving voltage line 220 is arranged on one side, away from a common voltage line 210, of a last source voltage line 230. The second conductive layer may further include: a plurality of jumper lines 120, the element groups arranged at the second hollowed-out gaps are electrically connected to the driving voltage lines 220 arranged on one sides, away from the common voltage lines 210, of the source voltage lines 230 through the jumper lines 120. Exemplarily, the element groups Z-3 are arranged at the second hollowed-out gaps, and the element groups Z-3 are electrically connected to the driving voltage lines 220 arranged on one sides, away from the common voltage lines 210, of the source voltage lines 230 through the jumper lines 120.

During a specific implementation, in the embodiment of the present disclosure, as shown in FIG. 6, orthogonal projections of the jumper lines 120 on the substrate do not overlap orthogonal projections of the common voltage lines 210 on the substrate.

During a specific implementation, in the embodiment of the present disclosure, as shown in FIG. 6, the second conductive layer may further include: a plurality of second connectors 130. In the same light-emitting component PX, the element groups arranged on one side, facing the driving voltage line 220, of the common voltage line 210 are electrically connected to the same driving voltage line 220 through the second connectors 130, respectively. Exemplarily, the element group Z-1 is electrically connected to the driving voltage line 220 through one second connector 130, and the element group Z-2 is electrically connected to the same driving voltage line 220 through one second connector 130.

With reference to FIGS. 1A and 1B, in practical applications, the first conductive layer 01 and the second conductive layer 02 are generally made of Cu with low resistance. The active Cu is likely to be corroded under the action of the electric field. A potential difference between the first conductive layer 02 and the second conductive layer 04 forms an electrochemical corrosion anode and a protective cathode. The second conductive layer 04 is a positive electrode to be subjected to an oxidation reaction, and the first conductive layer 02 is a negative electrode to be subjected to a reduction reaction. Continuous electrochemical corrosion leads to a short circuit of contact between the first conductive layer 02 and the second conductive layer 04. However, if electrochemical corrosion exists in the light-emitting substrate, the light-emitting stability of the light-emitting substrate will be affected.

In the embodiment of the present disclosure, since the voltage loaded on the driving voltage lines is greater than the voltage loaded on the common voltage lines, and both the second connectors 130 and the jumper lines 120 are electrically connected to the driving voltage lines, the voltages on both the second connectors 130 and the jumper lines 120 are greater than the voltage loaded on the common voltage lines. In the embodiments of the present disclosure, the light-emitting elements on the two sides of the common voltage lines are connected to the driving voltage lines on the two sides of the common voltage lines, so that the orthographic projections, on the substrate, of the jumper lines are prevented from overlapping those, on the substrate, of the common voltage lines, to avoid areas where the jumper lines and the common voltage lines are opposite each other, and a reduction reaction of the jumper lines serving as cathodes and an oxidation reaction of the common voltage lines serving as anodes may be avoided. Moreover, the jumper lines are protected by the second insulation layer, and far away from an invasion path of water. Therefore, the electrochemical corrosion may be effectively reduced.

In practical applications, in order to reduce the electrochemical corrosion, a thickness and the number of layers of the first insulation layer may be increased. However, in the embodiment of the present disclosure, the orthographic projections, on the substrate, of the jumper lines overlap those, on the substrate, of the common voltage lines, to avoid areas where the jumper lines and the common voltage lines are opposite each other, so that a reduction reaction of the jumper lines serving as cathodes and an oxidation reaction of the common voltage lines serving as positive electrodes may be avoided, and the electrochemical corrosion may be effectively reduced. Therefore, the thickness and the number of layers of the first insulation layer are not required to be additionally increased, thereby saving on productivity.

During a specific implementation, in the embodiment of the present disclosure, as shown in FIGS. 6 and 7A, the orthographic projections of the jumper lines 120 on the substrate do not overlap the orthographic projections of the connection pads PDs on the substrate. For example, as shown in FIGS. 6 and 7A, portions BG, close to the driving voltage lines electrically connected, of the jumper lines may include first avoidance portions 121 and second avoidance portions 122, where the first avoidance portions 121 extend in the first direction F1, the second avoidance portions 122 extend in the second direction F2, and a length H1 of a second avoidance portion 122 ranges from 3.0 mm to 3.1 mm. For example, a length H1 of a second avoidance portion 122 may be 3.0 mm. The length H1 of the second avoidance portion 122 may also be 3.05 mm. The length H1 of the second avoidance portion 122 may also be 3.1 mm. Certainly, in practical applications, the length H1 of the second avoidance portion 122 may be designed and determined according to requirements of practical applications, which is not limited herein.

During a specific implementation, in the embodiment of the present disclosure, as shown in FIGS. 6 and 7A, in the same row, first avoidance gaps are provided between one sides, facing second avoidance portions 122, of second connectors 130 electrically connected to driving voltage lines 220 and one sides, away from the second connectors 130, of the second avoidance portions 122, where a width H2 of a first avoidance gap ranges from 0.9 mm to 1.0 mm. Exemplarily, the width H2 of the first avoidance gap may be 0.9 mm. The width H2 of the first avoidance gap may also be 0.95 mm. The width H2 of the first avoidance gap may also be 1.0 mm. Certainly, in practical applications, the width H2 of the first avoidance portion may be designed and determined according to requirements of practical applications, which is not limited herein.

During a specific implementation, in the embodiment of the present disclosure, as shown in FIG. 6, a plurality of element groups of the light-emitting components PX are sequentially numbered in the second direction F2, light-emitting component PX columns are sequentially numbered in the second direction F2, a first light-emitting element QD1 in an element group numbered k of a light-emitting component numbered a is electrically connected to a driving voltage line 220 corresponding to the light-emitting component PX numbered a, and a first light-emitting element QD1 in the element group numbered M of the light-emitting component PX numbered a is electrically connected to a driving voltage line 220 corresponding to a light-emitting component PX numbered a+1, a being an integer greater than 0, 1≤k≤M, and k being an integer. Exemplarily, for example, the light-emitting component PX includes nine light-emitting elements QD1, M=3, N=3, k=1, and k=2, as shown in FIG. 6, an element group numbered 1 is Z-1, an element group numbered 2 is Z-2, and an element group numbered 3 is Z-3. In the light-emitting component PX numbered a, a negative electrode of a last light-emitting element QD1 in the element group Z-1 numbered 1 is electrically connected to a negative electrode of a last light-emitting element QD1 in the element group Z-2 numbered 2 through one first connector 110. Moreover, in the light-emitting component PX numbered a, the negative electrode of the last light-emitting element QD1 in the element group Z-2 numbered 2 is electrically connected to a negative electrode of a last light-emitting element QD1 in the element group Z-3 numbered 3 through one first connector 110. In the light-emitting component PX numbered a, the negative electrode of the last light-emitting element QD1 in the element group Z-3 numbered 3 is electrically connected to the output end of the driving circuit QD0. Certainly, in practical applications, specific values of a, k, and M may be set according to requirements of practical applications, which is not limited herein.

During a specific implementation, in the embodiment of the present disclosure, as shown in FIG. 6, one column of the light-emitting components PX are sequentially numbered in the first direction F1, and an output end of a driving circuit QD0 of a light-emitting component PX numbered b is coupled to a first input end of a driving circuit QD0 of a light-emitting component PX numbered b+1 through a cascade line 240, b being an integer greater than 0. Exemplarily, when b=1, an output end of a driving circuit QD0 of a light-emitting component PX numbered 1 is coupled to a first input end of a driving circuit QD0 of a light-emitting component PX numbered 2 through a cascade wire 240. When b=2, an output end of a driving circuit QD0 of a light-emitting component PX numbered 2 is coupled to a first input end of a driving circuit QD0 of a light-emitting component PX numbered 3 through a cascade wire 240. When b=3, an output end of a driving circuit QD0 of a light-emitting component PX numbered 3 is coupled to a first input end of a driving circuit QD0 of a light-emitting component PX numbered 4 through a cascade wire 240. When b=4, an output end of a driving circuit QD0 of a light-emitting component PX numbered 4 is coupled to a first input end of a driving circuit QD0 of a light-emitting component PX numbered 5 through a cascade wire 240. Certainly, in practical applications, a specific value of b may be set according to requirements of practical applications, which is not limited herein.

During a specific implementation, in the embodiment of the present disclosure, as shown in FIGS. 3, 6, and 7B, the cascade wires 240 may be arranged on the first conductive layer. Moreover, the first conductive layer further includes a cascade connection line 241, and the second conductive layer further includes a cascade bridge portion 242. A first end of the cascade wire 240 is electrically connected to a last light-emitting element QD1 in the element group numbered M of the light-emitting component PX numbered a, and a second end of the cascade wire 240 is electrically connected to a first input end of a driving circuit QD0 of the light-emitting component PX numbered a+1. Moreover, an output end of a driving circuit QD0 of the light-emitting component PX numbered a is electrically connected to a first end of the cascade connection line 241 through a first cascade via hole GL1, a second end of the cascade connection line 241 is electrically connected to a first end of the cascade bridge portion 242 through a second cascade via hole GL2, and a second end of the cascade bridge portion 242 is electrically connected to a first end of the cascade wire 240 through a third cascade via hole GL3. Exemplarily, a second end of the cascade wire 240 is electrically connected to the first input end of the driving circuit QD0 of the light-emitting component PX numbered a+1 through a fourth cascade via hole GL4.

During a specific implementation, in the embodiment of the present disclosure, as shown in FIGS. 6 and 7B, the second conductive layer further includes common bridge portions 211, first ends of the common bridge portions 211 being electrically connected to the common voltage ends of the driving circuits QD0 through first common via holes ND1, and second ends of the common bridge portions 211 being electrically connected to the common voltage lines 210 through second common via holes ND2.

During a specific implementation, in the embodiment of the present disclosure, as shown in FIGS. 6 and 7B, the first conductive layer further includes source connection lines 231, first ends of the source connection lines 231 being electrically connected to the second input ends Pwr of the driving circuits QD0 through source via holes WR, and second ends of the source connection lines 231 being directly electrically connected to the source voltage lines 230. Exemplarily, orthographic projections, on the substrate, the source connection lines 231 overlap those, on the substrate, of the cascade bridge portions 242.

During a specific implementation, in the embodiment of the present disclosure, as shown in FIGS. 6-7B, the two sides of the common voltage lines 210 are each provided with avoidance areas, and the connection pads PD arranged on the two sides of the common voltage lines 210 are positioned in the avoidance areas. For example, connection pads electrically connected to the light-emitting elements QD1 in the element group Z-2 numbered 2 are positioned in avoidance areas on one sides, facing the driving voltage lines 220, of the common voltage lines 210, and connection pads electrically connected to the light-emitting elements QD1 in the element group Z−3 numbered 3 are positioned in avoidance area on one sides, away from the driving voltage lines 220, of the common voltage lines 210. That is to say, the orthographic projections, on the substrate, of the common voltage lines 210 do not overlap those, on the substrate, of the connection pads electrically connected to the light-emitting elements QD1 in the element group Z-2 numbered 2 and the connection pads electrically connected to the light-emitting elements QD1 in the element group Z-3 numbered 3.

Figure 8:
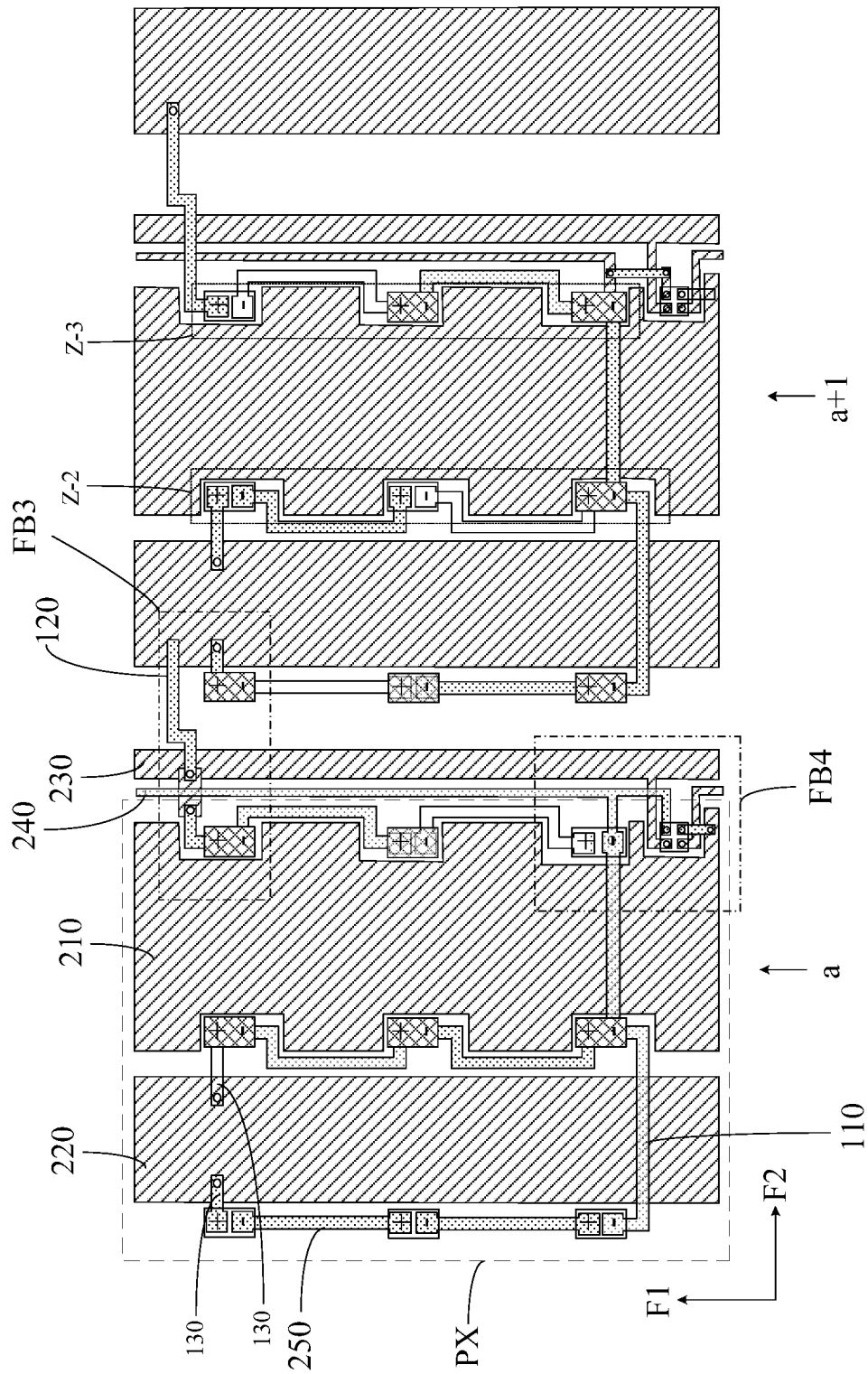
FIG. 8 shows some local schematic arrangement diagrams of a light-emitting substrate in an embodiment of the present disclosure.
Figure 9A:
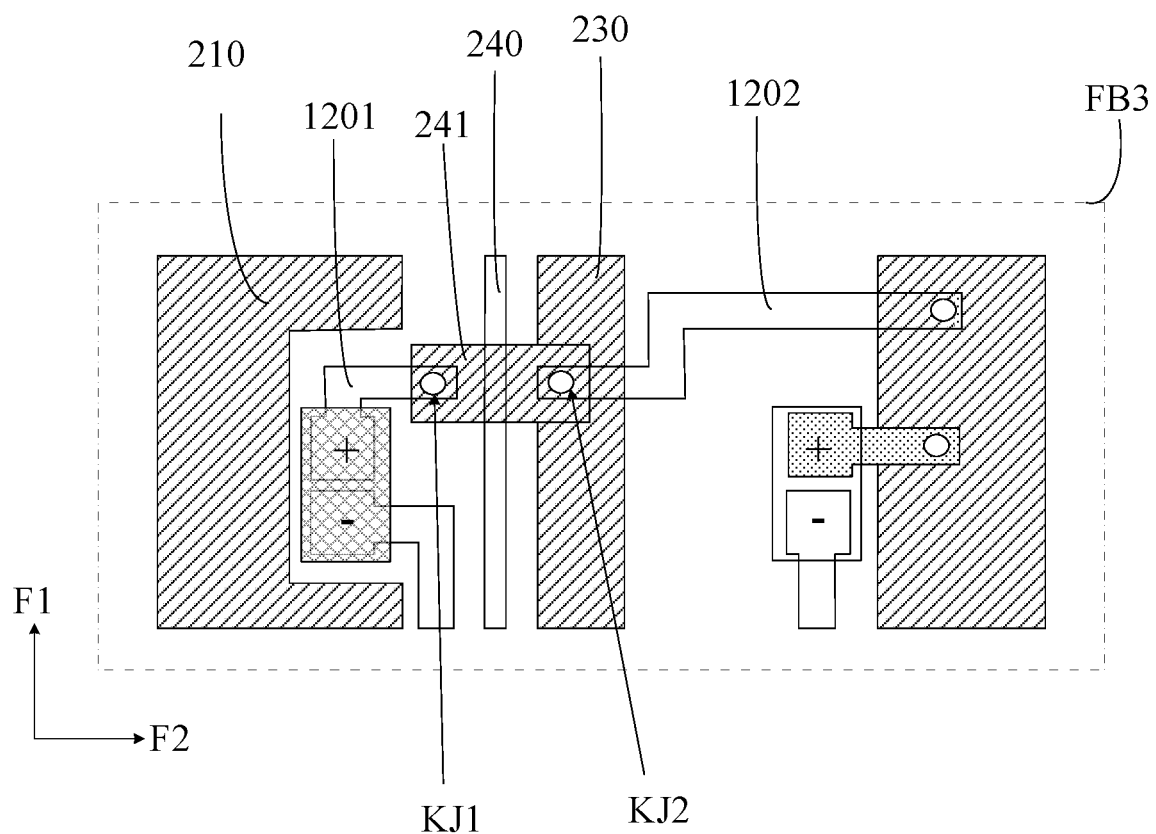
FIG. 9A is an enlarged schematic arrangement diagram of an area FB3 in FIG. 8.
Figure 9B:
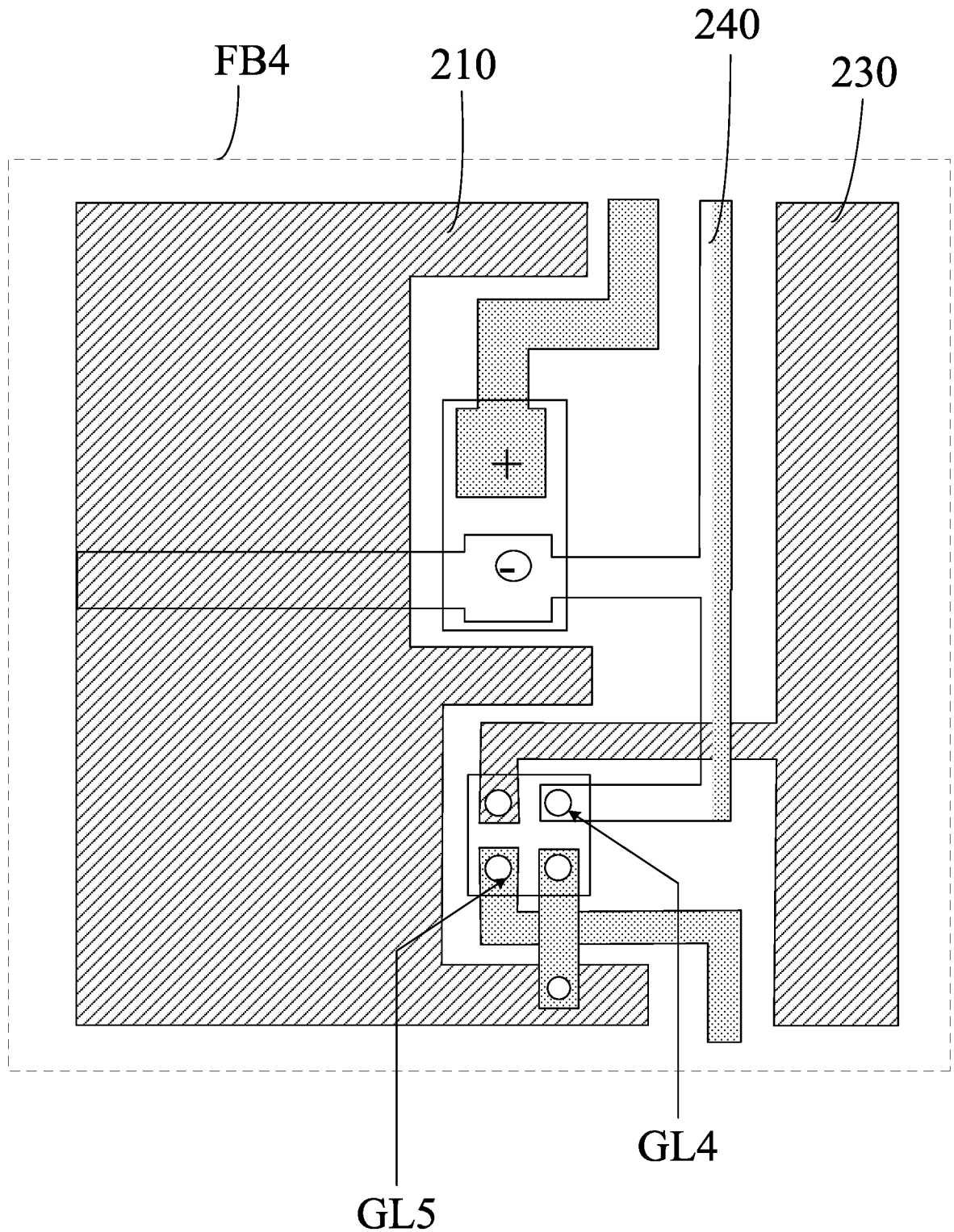
FIG. 9B is an enlarged schematic arrangement diagram of an area FB4 in FIG. 8.

The embodiment of the present disclosure provides structural schematic diagrams of some other light-emitting substrates, as shown in FIGS. 8-9B, which are transformed with respect to the implementations in the embodiment described above. Only differences between the present embodiment and the embodiments described above will be described below, and the similarities are not described in detail herein.

During a specific implementation, in the embodiment of the present disclosure, as shown in FIGS. 8 and 9A, a first end of a cascade wire 240 is electrically connected to an output end of a driving circuit QD0 of an light-emitting component PX numbered a, and a second end of the cascade wire 240 is electrically connected to a first input end of a driving circuit QD0 of a light-emitting component PX numbered a+1. The cascade wires 240 may be arranged on a second conductive layer. Moreover, the first end of the cascade wire 240 is electrically connected to the output end of the driving circuit QD0 of the light-emitting component PX numbered a through a fourth cascade via hole GL4, and the second end of the cascade wire 240 is electrically connected to the first input end of the driving circuit QD0 of the light-emitting component PX numbered a+1 through a fifth cascade via hole GL5.

During a specific implementation, in the embodiment of the present disclosure, as shown in FIGS. 8 and 9A, a first conductive layer may further include jumper bridge portions 241, the jumper lines 120 including a first jumper line 1201 and a second jumper line 1202, the second jumper line 1202 being provided with an avoidance graph BG. Moreover, a first light-emitting element QD1 in an element group numbered M of the light-emitting component PX numbered a is electrically connected to a first end of the first jumper line 1201, a second end of the first jumper line 1201 is electrically connected to a first end of the jumper bridge portion 241 through a first jumper via hole KJ1, a second end of the jumper bridge portion 242 is electrically connected to a first end of the second jumper line 1202 through a second jumper via hole KJ2, and a second end of the second jumper line 1202 is electrically connected to a driving voltage line 220 corresponding to the light-emitting component PX numbered a+1. The first jumper via hole KJ1 and the second jumper via hole KJ2 penetrate the first insulation layer, respectively.

During a specific implementation, in the embodiment of the present disclosure, as shown in FIGS. 8 and 9b, orthogonal projections, on the substrate, of the jumper bridge portions 241 overlap those, on the substrate, of the cascade wires 240. Moreover, orthographic projections, on the substrate, of the jumper lines 120 do not overlap those, on the substrate, of the cascade wires.

Figure 10:
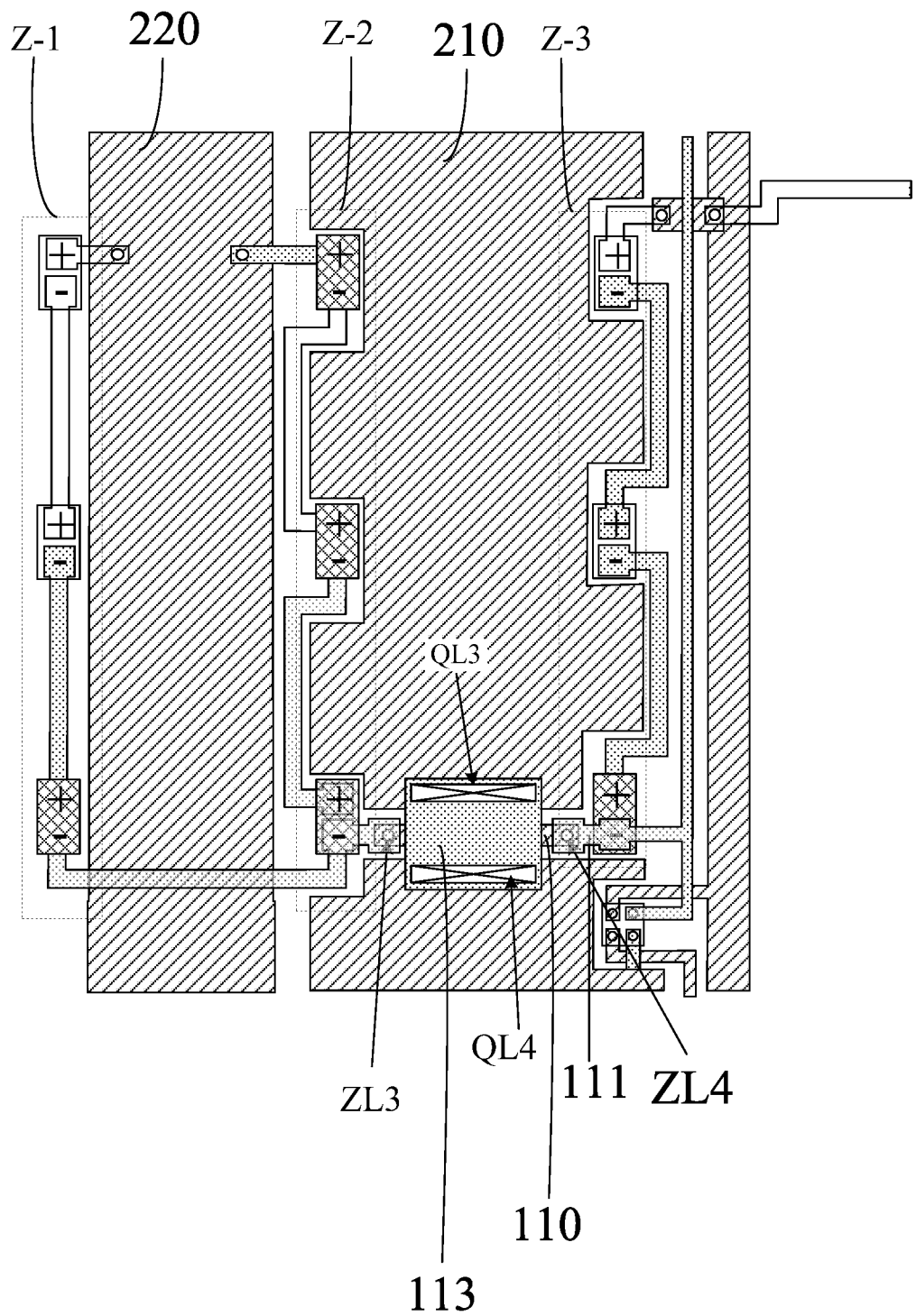
FIG. 10 shows some other local schematic arrangement diagrams of a light-emitting substrate in an embodiment of the present disclosure.

The embodiment of the present disclosure provides structural schematic diagrams of still other light-emitting substrates, as shown in FIG. 10, which are transformed with respect to the implementations in the embodiments described above. Only differences between the present embodiment and the embodiments described above will be described below, and the similarities are not described in detail herein.

During a specific implementation, in the embodiment of the present disclosure, as shown in FIG. 10, first connectors 110 may be arranged on a first conductive layer. For example, first connectors 110 electrically connected to element groups arranged on two sides of common voltage lines 210 may be located on the first conductive layer.

An adapter portion connected to a negative electrode of a last light-emitting element QD1 in an element group Z-2 is electrically connected to an adapter portion connected to a negative electrode of a last light-emitting element QD1 in an element group Z-3 through the first connector 110 arranged on the first conductive layer. Exemplarily, for the first connector 110 connected between the element group Z-2 and the element group Z-3, the adapter portion electrically connected to the negative electrode of the last light-emitting element QD1 in the element group Z-2 is electrically connected to a first end of the first connector 110 through a via hole ZL3, and the adapter portion electrically connected to the negative electrode of the last light-emitting element QD1 in the element group Z-3 is electrically connected to a second end of the first connector 110 through a via hole ZL4.

During a specific implementation, in the embodiment of the present disclosure, as shown in FIG. 10, the common voltage lines 210 are divided into a plurality of second line segments, and the second conductive layer further includes second line segment bridge portions 113. A first connector 110 is arranged in a gap between second adjacent line segments of the same common voltage line 210, and in the same common voltage line 210, second adjacent line segments are electrically connected through the second line segment bridge portion 113. Exemplarily, for two second adjacent line segments in the same common voltage line 210, a first end of the second line segment bridge portion 113 is electrically connected to one second line segment through a via hole QL3, and a second end of the second line segment bridge portion 113 is electrically connected to the other second line segment through a via hole QL4.

During a specific implementation, in the embodiment of the present disclosure, as shown in FIG. 10, orthographic projections, on the substrate, of the second line segment bridge portions 113 overlap those, on the substrate, of the first connectors 110. Moreover, the orthographic projections, on the substrate, of the first connectors 110 do not overlap those, on the substrate, of the common voltage lines 210.

Based on the same concept disclosed, an embodiment of the present disclosure further provides a display device, including the above light-emitting substrate provided in the embodiment of the present disclosure. The principle for solving problems of the display device is similar to that of the foregoing light-emitting substrate. Therefore, reference may be made to the implementation of the foregoing light-emitting substrate for the implementation of the display device, and similarities will not be described in detail herein.

During a specific implementation, in the embodiment of the present disclosure, the display device may be: any product or component with a display function, such as a mobile phone, a tablet computer, a television, a display, a laptop, a digital photo frame, and a navigator. Other essential constituents provided for the display device should all be understood by a person of ordinary skill in the art, will not be described in detail herein, and should not be taken as the limitation on the present disclosure.

Obviously, a person skilled in the art may make various amendments and variations to the present disclosure without departing from the spirit and scope of the present disclosure. In this way, it is intended that the present disclosure also includes these amendments and variations if these amendments and variations to the present disclosure fall within the scope of the claims of the present disclosure and equivalents thereof.

What is claimed is:

1. A light-emitting substrate, comprising:
a substrate;
a first conductive layer arranged on the substrate and comprising a plurality of driving voltage lines arranged at intervals; and
a plurality of light-emitting components arranged on one side, away from the substrate, of the first conductive layer, wherein each of the plurality of light-emitting components comprises a plurality of light-emitting elements, and the plurality of light-emitting elements are divided into a plurality of element groups;
wherein in a same light-emitting component, at least two of the plurality of element groups are electrically connected to different driving voltage lines;
wherein one of the plurality of light-emitting components is connected to two driving voltage lines, an orthographic projection of one of the two driving voltage lines on the substrate overlaps an orthographic projection of the light-emitting component on the substrate, and an orthographic projection of the other driving voltage line on the substrate does not overlap the orthographic projection of the light-emitting component on the substrate;
wherein the light-emitting substrate further comprises:
a first insulation layer arranged between the first conductive layer and the plurality of light-emitting components;
a second conductive layer arranged between the first insulation layer and the plurality of light-emitting components; and
a second insulation layer arranged between the second conductive layer and the plurality of light-emitting components,
wherein the second conductive layer comprises a plurality of element wires arranged at intervals; and
in each of the plurality of element groups, two adjacent light-emitting elements are electrically connected to each other through an element wire;
wherein one column of the light-emitting components correspond to one of the driving voltage lines, one of the common voltage lines, and one of the source voltage lines; and in the second direction, one driving voltage line is arranged on one side, away from the common voltage line, of a last source voltage line; and
the second conductive layer comprises: a plurality of jumper lines, wherein element groups arranged at second hollowed-out gaps are electrically connected to driving voltage lines arranged on one sides, away from the common voltage lines, of the source voltage lines through the jumper lines;
wherein the second conductive layer further comprises a plurality of connection pads; one electrode of each of the light-emitting elements is electrically connected to one connection pad; and
orthographic projections of the jumper lines on the substrate do not overlap orthographic projections of the connection pads on the substrate;
wherein the second conductive layer further comprises a plurality of second connectors, in the same light-emitting component, and element groups arranged on one side, facing the driving voltage line, of the common voltage line are electrically connected to a same driving voltage line through the second connectors, respectively;
portions, close to the driving voltage lines electrically connected, of the jumper lines comprise first avoidance portions and second avoidance portions, the first avoidance portions extend in the first direction, the second avoidance portions extend in the second direction, and a length of a second avoidance portion ranges from 3.0 mm to 3.1 mm; and
in the same row, first avoidance gaps are provided between one sides, facing the second avoidance portions, of second connectors electrically connected to the driving voltage lines and one sides, away from the second connectors, of the second avoidance portions, and a width of a first avoidance gap ranges from 0.9 mm to 1.0 mm.

2. The light-emitting substrate according to claim 1, wherein the first conductive layer further comprises a plurality of common voltage lines and a plurality of source voltage lines arranged at intervals;
the plurality of driving voltage lines, the plurality of common voltage lines, and the plurality of source voltage lines extend in a first direction, and are repeatedly arranged in a second direction in an order of the driving voltage lines, the common voltage lines, and the source voltage lines;
a plurality of first hollowed-out gaps are provided between driving voltage lines and common voltage lines adjacent to each other, a plurality of second hollowed-out gaps are provided between common voltage lines and source voltage lines adjacent to each other, and a plurality of third hollowed-out gaps are provided between source voltage lines and driving voltage lines adjacent to each other; and the plurality of first hollowed-out gaps, the plurality of second hollowed-out gaps, and the plurality of third hollowed-out gaps are each provided with one element group in one column of the light-emitting components and element wires connected between adjacent light-emitting elements in the element group.

3. The light-emitting substrate according to claim 2, wherein two sides of the common voltage lines are provided with different element groups of a same light-emitting component; and the element groups arranged on the two sides of the common voltage lines are electrically connected to different driving voltage lines.

4. The light-emitting substrate according to claim 1, wherein in the same light-emitting component, different element groups are arranged in parallel through first connectors; and in the same light-emitting component, parallel connection positions have a lowest voltage;

wherein a voltage on a first connector is lower than or equal to a voltage of a common voltage line;

wherein the voltage on the common voltage line is a grounding voltage;

wherein a voltage on a first connector is lower than or equal to a voltage of a driving voltage line.

5. The light-emitting substrate according to claim 1, wherein a quantity of light-emitting components electrically connected to each of a second driving voltage line to an $(N-1)^{th}$ driving voltage line is the same, and N is a total quantity of driving voltage lines in the light-emitting substrate.

6. The light-emitting substrate according to claim 5, wherein a quantity of element groups electrically connected to each of the second driving voltage line to the $(N-1)^{th}$ driving voltage line is the same;

wherein a quantity of light-emitting elements electrically connected to each of the second driving voltage line to the $(N-1)^{th}$ driving voltage line is the same.

7. The light-emitting substrate according to claim 1, wherein orthographic projections of the jumper lines on the substrate do not overlap orthographic projections of the common voltage lines on the substrate.

8. The light-emitting substrate according to claim 1, wherein each of the light-emitting components further comprises a driving circuit, and the driving circuit comprises a common voltage end and an output end;

the common voltage end is electrically connected to a common voltage line; and in the same light-emitting component, last light-emitting elements in different element groups are electrically connected to the output end.

9. The light-emitting substrate according to claim 1, wherein the plurality of light-emitting elements in the plurality of light-emitting components are divided into M element groups, each of the M element groups comprises N light-emitting elements arranged in the first direction, the M element groups are arranged in the second direction, N is an integer greater than 0, and M is an integer greater than 0;

the plurality of element groups in the plurality of light-emitting components are sequentially numbered in the second direction, light-emitting component columns are sequentially numbered in the second direction, a first light-emitting element in an element group numbered k in a light-emitting component numbered a is electrically connected to a driving voltage line corresponding to the light-emitting component numbered a, and a first light-emitting element in an element group numbered M in the light-emitting component numbered a is electrically connected to a driving voltage line corresponding to a light-emitting component numbered a+1; and in the light-emitting component numbered a, a last light-emitting element in the element group numbered k is electrically connected to a last light-emitting element in an element group numbered k+1 through a first connector; and a last light-emitting element in the element group numbered M in the light-emitting component numbered a is electrically connected to an output end of a driving circuit, wherein a is an integer greater than 0, 1≤k<M, and k is an integer.

10. The light-emitting substrate according to claim 9, wherein cascade wires are arranged on the first conductive layer, the first conductive layer further comprises a cascade connection line, and the second conductive layer further comprises a cascade bridge portion;

a first end of the cascade wire is electrically connected to the last light-emitting element in the element group numbered M in the light-emitting component numbered a, and a second end of the cascade wire is electrically connected to a first input end of a driving circuit in the light-emitting component numbered a+1; and an output end of a driving circuit in the light-emitting component numbered a is electrically connected to a first end of the cascade connection line through a first cascade via hole, a second end of the cascade connection line is electrically connected to a first end of the cascade bridge portion through a second cascade via hole, and a second end of the cascade bridge portion is electrically connected to the first end of the cascade wire through a third cascade via hole.

11. The light-emitting substrate according to claim 10, wherein the cascade wires are arranged on the second conductive layer; a first end of the cascade wire is electrically connected to the output end of the driving circuit in the light-emitting component numbered a, and a second end of the cascade wire is electrically connected to the first input end of the driving circuit in a light-emitting component numbered a+1;

the first conductive layer further comprises a jumper bridge portion, and the jumper lines comprise a first jumper line and a second jumper line; and the first light-emitting element in the element group numbered M in the light-emitting component numbered a is electrically connected to a first end of the first jumper line, a second end of the first jumper line is electrically connected to a first end of the jumper bridge portion through a first jumper via hole, a second end of the jumper bridge portion is electrically connected to a first end of the second jumper line through a second jumper via hole, and a second end of the second jumper line is electrically connected to the driving voltage line corresponding to the light-emitting component numbered a+1.

12. The light-emitting substrate according to claim 9, wherein first connectors are arranged on the second conductive layer.

13. The light-emitting substrate according to claim 9, wherein first connectors electrically connected to element groups arranged on the two sides of the common voltage lines are arranged on the first conductive layer; and the common voltage lines are divided into a plurality of second line segments, the second conductive layer further comprises second line segment bridge portions, gaps between second adjacent line segments in the same common voltage line are provided with the first connectors, and second adjacent line segments in the same common voltage line are electrically connected through the second line segment bridge portions.

14. The light-emitting substrate according to claim 1, wherein the common voltage lines are provided with avoidance areas; and orthographic projections, on the substrate, of connection pads electrically connected to light-emitting elements arranged on the two sides of the common voltage lines are positioned in orthographic projections of the avoidance areas on the substrate.

15. A display device, comprising a light-emitting substrate, wherein the light-emitting substrate comprises:

a substrate;

a first conductive layer arranged on the substrate and comprising a plurality of driving voltage lines arranged at intervals; and a plurality of light-emitting components arranged on one side, away from the substrate, of the first conductive layer, wherein each of the plurality of light-emitting components comprises a plurality of light-emitting elements, and the plurality of light-emitting elements are divided into a plurality of element groups;

wherein in a same light-emitting component, at least two of the plurality of element groups are electrically connected to different driving voltage lines;

wherein one of the plurality of light-emitting components is connected to two driving voltage lines, an orthographic projection of one of the two driving voltage lines on the substrate overlaps an orthographic projection of the light-emitting component on the substrate, and an orthographic projection of the other driving voltage line on the substrate does not overlap the orthographic projection of the light-emitting component on the substrate;

wherein the light-emitting substrate further comprises:

a first insulation layer arranged between the first conductive layer and the plurality of light-emitting components;

a second conductive layer arranged between the first insulation layer and the plurality of light-emitting components; and a second insulation layer arranged between the second conductive layer and the plurality of light-emitting components, wherein the second conductive layer comprises a plurality of element wires arranged at intervals; and in each of the plurality of element groups, two adjacent light-emitting elements are electrically connected to each other through an element wire;

wherein one column of the light-emitting components correspond to one of the driving voltage lines, one of the common voltage lines, and one of the source voltage lines; and in the second direction, one driving voltage line is arranged on one side, away from the common voltage line, of a last source voltage line; and the second conductive layer comprises: a plurality of jumper lines, wherein element groups arranged at second hollowed-out gaps are electrically connected to driving voltage lines arranged on one sides, away from the common voltage lines, of the source voltage lines through the jumper lines;

wherein the second conductive layer further comprises a plurality of connection pads; one electrode of each of the light-emitting elements is electrically connected to one connection pad; and orthographic projections of the jumper lines on the substrate do not overlap orthographic projections of the connection pads on the substrate;

wherein the second conductive layer further comprises a plurality of second connectors, in the same light-emitting component, and element groups arranged on one side, facing the driving voltage line, of the common voltage line are electrically connected to a same driving voltage line through the second connectors, respectively;

portions, close to the driving voltage lines electrically connected, of the jumper lines comprise first avoidance portions and second avoidance portions, the first avoidance portions extend in the first direction, the second avoidance portions extend in the second direction, and a length of a second avoidance portion ranges from 3.0 mm to 3.1 mm; and in the same row, first avoidance gaps are provided between one sides, facing the second avoidance portions, of second connectors electrically connected to the driving voltage lines and one sides, away from the second connectors, of the second avoidance portions, and a width of a first avoidance gap ranges from 0.9 mm to 1.0 mm.

* * * * *